(12) United States Patent
Lee et al.

(10) Patent No.: US 9,412,450 B2
(45) Date of Patent: Aug. 9, 2016

(54) THREE-DIMENSIONAL NONVOLATILE MEMORY AND OPERATING METHOD OF THREE-DIMENSIONAL NONVOLATILE MEMORY

(71) Applicant: Samsung Electronics Co., Ltd., Suwon-si (KR)

(72) Inventors: Gilsung Lee, Seoul (KR); Jaehoon Jang, Seongnam-si (KR); Kihyun Kim, Seoul (KR); Sunil Shim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 109 days.

(21) Appl. No.: 14/155,877

(22) Filed: Jan. 15, 2014

(65) Prior Publication Data

US 2014/0241064 A1     Aug. 28, 2014

(30) Foreign Application Priority Data

Feb. 27, 2013   (KR) ......................... 10-2013-0021434

(51) Int. Cl.
*G11C 11/34* (2006.01)
*G11C 16/04* (2006.01)
*G11C 16/26* (2006.01)

(52) U.S. Cl.
CPC ............ *G11C 16/0483* (2013.01); *G11C 16/26* (2013.01)

(58) Field of Classification Search
USPC ............... 365/185.03, 185.17, 185.18, 185.2, 365/185.24, 185.27, 185.29, 185.33
See application file for complete search history.

(56) References Cited

U.S. PATENT DOCUMENTS

| | | | |
|---|---|---|---|
| 5,894,435 A | 4/1999 | Nobukata | |
| 7,349,258 B2 | 3/2008 | Fong et al. | |
| 7,457,160 B2 | 11/2008 | Kang et al. | |
| 7,535,764 B2 | 5/2009 | Chin et al. | |
| 7,593,259 B2 | 9/2009 | Kim | |
| 7,630,251 B2 * | 12/2009 | Hosono | 365/185.2 |
| 7,782,675 B2 * | 8/2010 | Matsunaga et al. | 365/185.2 |
| 7,869,280 B2 * | 1/2011 | Kosaki et al. | 365/185.2 |
| 8,018,777 B2 | 9/2011 | Kang | |
| 8,154,927 B2 | 4/2012 | Lee et al. | |
| 8,194,461 B2 * | 6/2012 | Kosaki et al. | 365/185.2 |
| 8,379,456 B2 * | 2/2013 | Park et al. | 365/185.18 |
| 8,522,115 B2 * | 8/2013 | Kim et al. | 365/185.17 |
| 8,737,134 B2 * | 5/2014 | Shiino et al. | 365/185.2 |

(Continued)

FOREIGN PATENT DOCUMENTS

| | | |
|---|---|---|
| KR | 10-2011-0001100 A | 1/2011 |
| KR | 2011-0038083 A | 4/2011 |

*Primary Examiner* — Trong Phan
(74) *Attorney, Agent, or Firm* — Muir Patent Law, PLLC

(57) ABSTRACT

Disclosed is a nonvolatile memory having a memory cell array including a plurality of cell strings, each cell string including memory cells stacked in a direction perpendicular to a substrate, a ground selection transistor between the memory cells and the substrate, and a string selection transistor between the memory cells and a bit line. The memory also includes an address decoder connected to the memory cells, the string selection transistors, and the ground selection transistors, and configured to apply a ground voltage to the string selection lines, word lines, and ground selection line. Further, the memory includes a read/write circuit connected to the string selection transistors through bit lines, and at least one first memory cell maintains a threshold voltage higher than a threshold voltage distribution corresponding to an erase state.

19 Claims, 24 Drawing Sheets

(56) References Cited

U.S. PATENT DOCUMENTS

| | | | |
|---|---|---|---|
| 8,885,411 B2 * | 11/2014 | Kamigaichi | 365/185.17 |
| 8,976,592 B2 * | 3/2015 | Park et al. | 365/185.17 |
| 9,013,923 B2 * | 4/2015 | Park | 365/185.2 |
| 9,093,171 B2 * | 7/2015 | Kim | G11C 11/5628 |
| 9,165,660 B2 * | 10/2015 | Lee | G11C 16/10 |
| 9,183,939 B2 * | 11/2015 | Nam | G11C 16/26 |
| 2009/0135656 A1 | 5/2009 | Park | |
| 2009/0323412 A1 | 12/2009 | Mokhlesi et al. | |
| 2011/0199829 A1 * | 8/2011 | Lee | G11C 16/0483 365/185.17 |
| 2012/0250414 A1 | 10/2012 | Khandelwal et al. | |
| 2012/0307561 A1 | 12/2012 | Joo et al. | |

\* cited by examiner

THREE-DIMENSIONAL NONVOLATILE MEMORY AND OPERATING METHOD OF THREE-DIMENSIONAL NONVOLATILE MEMORY

CROSS-REFERENCE TO RELATED APPLICATIONS

A claim for priority under 35 U.S.C. §119 is made to Korean Patent Application No. 10-2013-0021434 filed Feb. 27, 2013, in the Korean Intellectual Property Office, the entire contents of which are hereby incorporated by reference.

BACKGROUND

This disclosure relates to a semiconductor memory, and more particularly, relates to a nonvolatile memory and an operating method of the nonvolatile memory.

A semiconductor memory device is a memory device that is fabricated using semiconductors such as silicon (Si), germanium (Ge), gallium arsenide (GaAs), indium phosphide (InP), and so on. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on. The flash memory device may be divided into a NOR type and a NAND type.

In recent years, three-dimensional semiconductor memory devices have been researched to improve the level of integration of a semiconductor memory device. A structural characteristic of the three-dimensional semiconductor memory device is different from that of a two-dimensional semiconductor memory. Thus, various different driving methods for driving the three-dimensional semiconductor memory device are used due to a structural difference between the three-dimensional semiconductor memory device and the two-dimensional semiconductor memory. The use of different driving methods may help overcome certain obstacles presented by the different architecture used for three-dimensional semiconductor memory devices.

SUMMARY

In one embodiment, an operating method is provided for a nonvolatile memory which includes a plurality of cell strings, each of the cell strings including a plurality of memory cells stacked in a direction perpendicular to a substrate, a ground selection transistor provided between the memory cells and the substrate, and a string selection transistor provided between the memory cells and a bit line. The operating method comprises adjusting a threshold voltage of at least one first memory cell adjacent to the substrate in each cell string to be higher than a threshold voltage distribution of an erase state; and reading a second memory cell located above the at least one first memory cell in each cell string. The at least one first memory cell in each cell string is a dummy cell.

In exemplary embodiments, the at least one first memory cell in each cell string is a memory cell closest among the stacked memory cells to the substrate.

In exemplary embodiments, the plurality of cell strings are arranged on the substrate in rows and columns, string selection transistors in a row of cell strings are connected in common to a string selection line, ground selection transistors in two or more rows of cell strings are connected in common to a ground selection line, and memory cells of the plurality of cell strings located at the same height from the substrate are connected in common to a word line.

In exemplary embodiments, the reading a second memory cell located above the at least one first memory cell in each cell string comprises applying a turn-on voltage to a selected string selection line from among string selection lines connected to the plurality of cell strings; applying a turn-off voltage to an unselected string selection line of the string selection lines; applying the turn-on voltage to a ground selection line connected to the plurality of cell strings; applying the turn-on voltage to an unselected word line from word lines connected to the plurality of cell strings; applying a read voltage to a selected word line of the word lines; and applying a ground voltage to the selected string selection line, the word lines, and the ground selection line.

In exemplary embodiments, when the ground voltage is applied to the word lines, first memory cells in the plurality of cell strings are turned off before a voltage of a first word line connected to the first memory cells in the plurality of cell strings reaches a level of the ground voltage.

In exemplary embodiments, a first word line, connected to first memory cells in the plurality of cell strings, from among the word lines is supplied with the ground voltage before the ground voltage is applied to second word lines connected to second memory cells in the plurality of cell strings.

In exemplary embodiments, the ground voltage is simultaneously supplied to the ground selection line and the first word line.

In exemplary embodiments, the reading a second memory cell located above the at least one first memory cell in each cell string comprises applying a turn-on voltage to a selected string selection line from string selection lines connected to the plurality of cell strings; applying a turn-off voltage to an unselected string selection line of the string selection lines; applying the turn-on voltage to a ground selection line connected to the plurality of cell strings; applying the turn-on voltage to an unselected word line from word lines connected to the plurality of cell strings; applying a read voltage to a selected word line of the word lines; and applying a ground voltage to the selected string selection line and the ground selection line, a negative voltage to a first word line, connected to first memory cells of the plurality of cell strings, from among the word lines, and the ground voltage to second word lines connected to second memory cells of the plurality of cell strings.

In exemplary embodiments, the negative voltage is applied to the first word line before the ground voltage is applied to the second word lines.

In exemplary embodiments, the reading a second memory cell located above the at least one first memory cell in each cell string comprises applying a turn-on voltage to a selected string selection line from string selection lines connected to the plurality of cell strings; applying a turn-off voltage to an unselected string selection line of the string selection lines; applying the turn-on voltage to a ground selection line connected to the plurality of cell strings; applying the turn-on voltage to an unselected word line from word lines connected to the plurality of cell strings; applying a read voltage to a selected word line of the word lines, the selected word line connected to the second memory cell; and applying a ground voltage to the selected string selection line, a negative voltage to the ground selection line and a first word line, connected to first memory cells of the plurality of cell strings, from among the word lines, and the ground voltage to second word lines connected to second memory cells of the plurality of cell strings.

In exemplary embodiments, the reading a second memory cell located above the at least one first memory cell in each cell string comprises applying a turn-on voltage to one selected from string selection lines connected to the plurality of cell strings; applying a turn-off voltage to an unselected string selection line of the string selection lines; applying the turn-on voltage to a ground selection line connected to the plurality of cell strings; applying the turn-on voltage to an unselected word line connected to the plurality of cell strings; applying a read voltage to a selected word line of the word lines; and applying a ground voltage to the selected string selection line and the word lines and a negative voltage to the ground selection line.

In exemplary embodiments, the operating method further comprises checking threshold voltages of first memory cells in the plurality of cell strings; and if the threshold voltages of first memory cells in the plurality of cell strings are determined to have decreased, re-adjusting the threshold voltages of the first memory cells in the plurality of cell strings to be higher than those in a threshold voltage distribution corresponding to an erase state.

In exemplary embodiments, the checking and the re-adjusting are performed periodically according to the number of read, write or erase operations performed.

In one embodiment, a controller is disclosed. The controller is for a nonvolatile memory comprising a memory cell array including a plurality of cell strings, each of the cell strings including a plurality of memory cells stacked in a direction perpendicular to a substrate, a ground selection transistor provided between the memory cells and the substrate, and a string selection transistor provided between the memory cells and a bit line; an address decoder connected to the memory cells in the plurality of cell strings through word lines, to string selection transistors of the plurality of cell strings through string selection lines, and to ground selection transistors of the plurality of cell strings through a ground selection line; and a read/write circuit connected to the string selection transistors of the plurality of cell strings through bit lines. The controller includes a processing unit, a memory, and a host interface. The controller is configured to: control a read operation including applying a read voltage to a selected word line of the word lines; cause a ground voltage to be applied, when the read operation ends, to the string selection lines, a first word line of the word lines, the selected word line of the word lines, the remaining word lines of the word lines, and the ground selection line; and cause at least one first memory cell, including a dummy memory cell closest to the substrate, from among the memory cells in each cell string, to maintain a threshold voltage higher than a threshold voltage distribution corresponding to an erase state.

In exemplary embodiments, the controller is further configured to cause the ground voltage to be applied to at least one of the first word line and the ground selection line; and subsequently cause the selected word to transition from the read voltage to the ground voltage.

In one embodiment, an operating method of a nonvolatile memory is disclosed. The memory includes a plurality of cell strings, each of the cell strings including a plurality of memory cells stacked in a direction perpendicular to a substrate and including a closest memory cell to the substrate and a furthest memory cell from the substrate, a ground selection transistor provided between the memory cells and the substrate, and a string selection transistor provided between the memory cells and a bit line. The operating method includes: at a first time, applying a first turn-on voltage to a selected string select line connected to a first cell string of the plurality of cell strings; at the first time, applying a second turn-on voltage to a ground select line connected to the ground selection transistor of the first cell string; at the first time, applying a third turn-on voltage to a first word line connected to the closest memory cell to the substrate for the first cell string; at a second time, applying a fourth voltage to a selected word line, the fourth voltage having a value among threshold distribution ranges of the plurality of memory cells, and the word line connected to a row of cell strings; at a third time subsequent to the first and second time, discharging or applying a negative voltage to at least one of the first word line and the ground select line; and at a fourth time subsequent to the third time, discharging the selected word line.

In one embodiment, the operating method further includes: at the third time, discharging or applying the negative voltage to the first word line; and at the fourth time, discharging the ground select line.

In one embodiment, the operating method includes: at the third time, discharging both the first word line and the ground select line.

In one embodiment, the operating method further includes: applying a pre-pulse to the selected word line prior to applying the fourth voltage to the selected word line.

The first word line may be a dummy word line.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
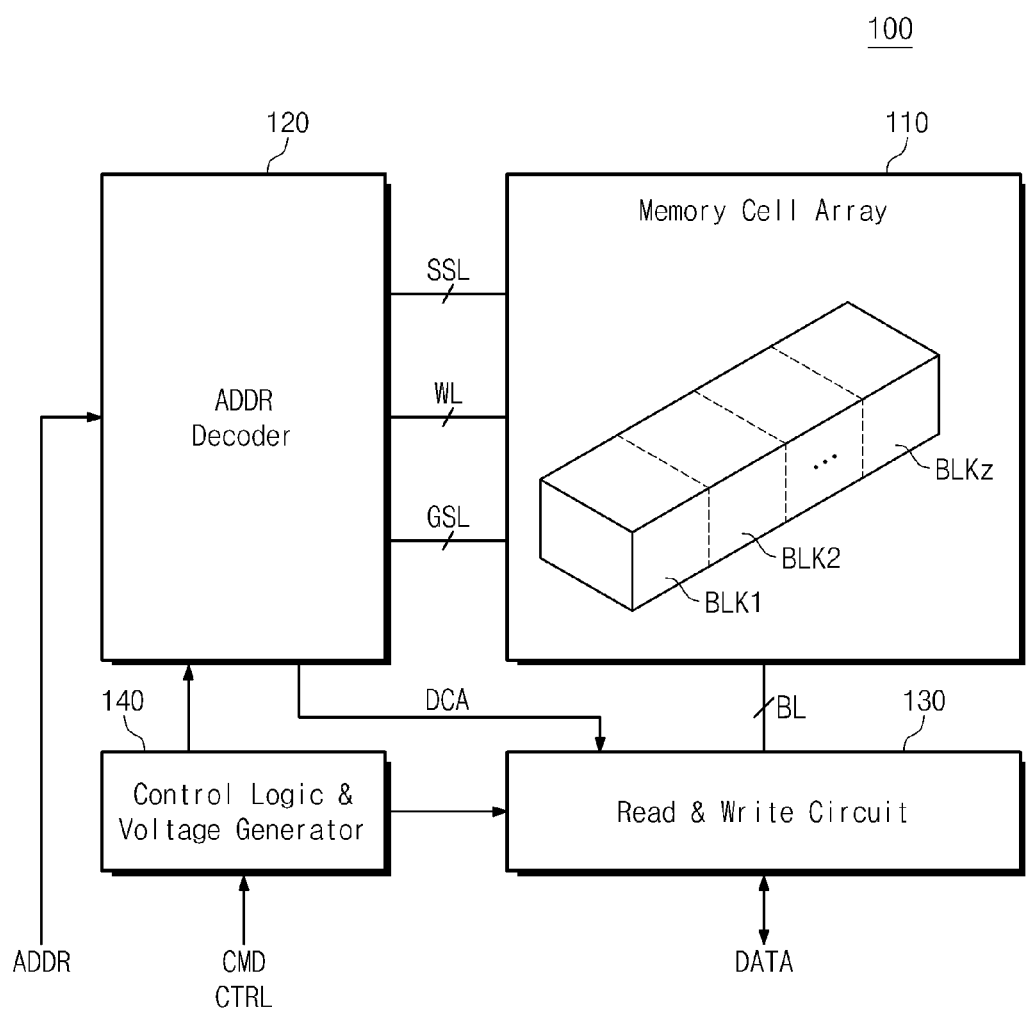
FIG. 1 is a block diagram schematically illustrating a nonvolatile memory device 100 according to one exemplary embodiment.

Embodiments will be described in detail with reference to the accompanying drawings. The inventive concept, however, may be embodied in various different forms, and should not be construed as being limited only to the illustrated embodiments. Accordingly, known processes, elements, and techniques are not described with respect to some of the embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term "selected memory block" may be used to indicate a memory block, selected for programming, erasing, or reading, from among a plurality of memory blocks. The term "selected sub block" may be used to indicate a sub block, selected for programming, erasing, or reading, from among a plurality of sub blocks in one memory block.

The term "selected bit line" or "selected bit lines" may be used to indicate a bit line or bit lines, connected to a cell transistor to be programmed or read, from among a plurality of bit lines. The term "unselected bit line" or "unselected bit lines" may be used to indicate a bit line or bit lines, connected to a cell transistor to be program-inhibited or read-inhibited, from among a plurality of bit lines.

The term "selected string selection line" may be used to indicate a string selection line, connected to a cell string including a cell transistor to be programmed or read, from among a plurality of string selection lines. The term "unselected string selection line" or "unselected string selection lines" may be used to indicate a remaining string selection line or remaining string selection lines other than the selected string selection line from among a plurality of string selection lines. The term "selected string selection transistors" may be used to indicate string selection transistors connected to a selected string selection line. The term "unselected string selection transistors" may be used to indicate string selection transistors connected to an unselected string selection line or unselected string selection lines.

The term "selected ground selection line" may be used to indicate a ground selection line, connected to a cell string including a cell transistor to be programmed or read, among a plurality of ground selection lines. The term "unselected ground selection line" may be used to indicate a remaining ground selection line or remaining ground selection lines other than the selected ground selection line from among a plurality of ground selection lines. The term "selected ground selection transistors" may be used to indicate ground selection transistors connected to a selected ground selection line. The term "unselected ground selection transistors" may be used to indicate ground selection transistors connected to an unselected ground selection line or unselected ground selection lines.

The term "selected word line" may be used to indicate a word line, connected to a cell transistor to be programmed or read, from among a plurality of word lines. The term "unselected word line" or "unselected word lines" may be used to indicate a remaining word lines or remaining word lines other than a selected word line from among a plurality of word lines.

The term "selected memory cell" or "selected memory cells" may be used to designate memory cells to be programmed or read among a plurality of memory cells. The term "unselected memory cell" or "unselected memory cells" may be used to indicate a remaining memory cell or remaining memory cells other than a selected memory cell or selected memory cells from among a plurality of memory cells.

Embodiments will be described with reference to a NAND flash memory. However, the inventive concept is not limited thereto. The embodiments disclosed herein may be applied to nonvolatile memory devices such as an Electrically Erasable and Programmable ROM (EEPROM), a NOR flash memory, a Phase-change RAM (PRAM), a Magnetic RAM (MRAM), a Resistive RAM (RRAM), a Ferroelectric RAM (FRAM), and the like.

FIG. 1 is a block diagram schematically illustrating a nonvolatile memory device 100 according to one exemplary embodiment. Referring to FIG. 1, an exemplary nonvolatile memory device 100 includes a memory cell array 110, an address decoder 120, a read/write circuit 130, and control logic and voltage generator block 140.

The memory cell array 110 may be connected to the address decoder 120 through word lines WL, string select lines SSL, and ground selection lines GSL and to the read/write circuit 130 through bit lines BL. The memory cell array 110 may include a plurality of memory blocks BLK1 to BLKz, each of which includes a plurality of memory cells and a plurality of selection transistors. In one embodiment, the memory cells are connected to the word lines, and the selection transistors are connected to the string select lines SSL or the ground selection lines GSL. The memory cells of each memory block may be stacked in a direction perpendicular to a substrate to form a three-dimensional structure. Each memory cell may store one or more bits.

The address decoder 120 may be connected to the memory cell array 110 through the word lines WL, the string select lines SSL, and the ground selection lines GSL. In one embodiment, the address decoder 120 is configured to operate in response to a control of the control logic and voltage generator block 140. The address decoder 120 may receive an address ADDR, for example, from an external device.

In one embodiment, the address decoder 120 is configured to decode a row address of the received address ADDR. The address decoder 120 may select the word lines WL, the string select lines SSL, and the ground selection lines GSL based on the decoded row address. The address decoder 120 may receive various voltages from the control logic and voltage generator block 140 to transfer the received voltages to selected and unselected string selection lines SSL, word lines WL and ground selection lines GSL.

The address decoder 120 may further be configured to decode a column address of the received address ADDR. The address decoder 120 may transfer the decoded column address DCA to the read/write circuit 130. For example, the address decoder 120 may include components such as a row decoder, a column decoder, an address buffer, and so on.

In one embodiment, the read/write circuit 130 is connected to the memory cell array 110 through bit lines BL, and may exchange data with the external device. The read/write circuit 130 may operate, for example, in response to a control of the control logic and voltage generator block 140. The read/write circuit 130 may receive the decoded column address DCA from the address decoder 120. The read/write circuit 130 may select the bit lines BL using the decoded column address DCA.

The read/write circuit 130 is configured to receive data from the external device, and write the received data in the memory cell array 110. The read/write circuit 130 is also configured to read data from the memory cell array 110 to transfer the read data to the external device. The read/write circuit 130 may also read data from a first storage region of the memory cell array 110 to write the read data in a second storage region of the memory cell array 110. For instance, the read/write circuit 130 may perform a copy-back operation.

The read/write circuit 130 may include components such as a page buffer (or, page register), a column selection circuit, a data buffer, and so on. In other exemplary embodiments, the read/write circuit 130 includes components such as a sense amplifier, a write driver, a column selection circuit, a data buffer, and so on.

The control logic and voltage generator block 140 is connected to the address decoder 120 and the read/write circuit 130. The control logic and voltage generator block 140 may be configured to control the overall operation of the nonvolatile memory device 100. The control logic and voltage generator block 140 may be configured to generate various voltages used by the nonvolatile memory device 100. In one embodiment, the control logic and voltage generator block 140 operates in response to a control signal CTRL and a command CMD transferred from the external device.

Figure 2:
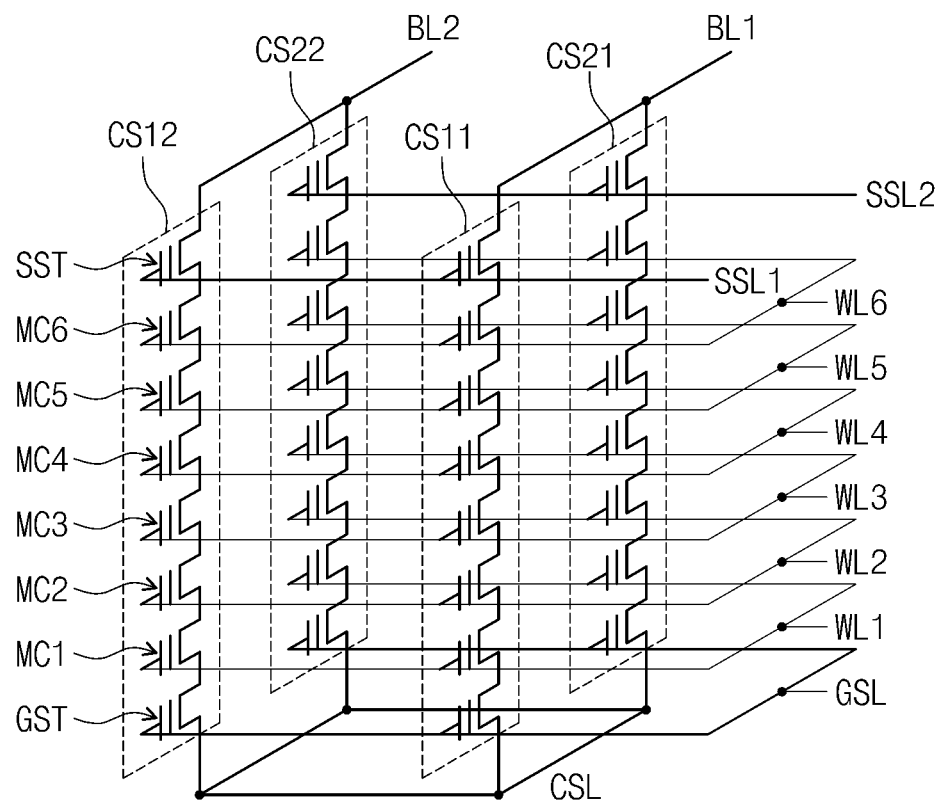
FIG. 2 is a circuit diagram schematically illustrating a memory block BLKa according to one exemplary embodiment.
Figure 2:
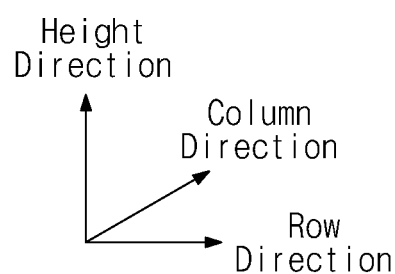

FIG. 2 is a circuit diagram schematically illustrating a memory block BLKa according to one exemplary embodiment. In FIG. 2, there is illustrated one of memory blocks BLK1 to BLKz of a memory cell array 110 of FIG. 1.

Referring to FIGS. 1 and 2, a memory block BLKa includes a plurality of cell strings CS11, CS21, CS12, and CS22. The cell strings CS11, CS21, CS12, and CS22 are arranged along a row direction and a column direction and form rows and columns.

Each of the cell strings CS11, CS21, CS12, and CS22 includes a ground selection transistor GST, memory cells MC1 to MC6, and a string selection transistor SST. In each of the cell strings CS11, CS21, CS12, and CS22, the ground selection transistor GST, the memory cells MC1 to MC6, and the string selection transistor SST are stacked in a height direction perpendicular to a substrate.

Rows of the cell strings CS11, CS21, CS12, and CS22 are connected to different string selection lines SSL1 and SSL2, respectively. For example, string selection transistors SST in the cell strings CS11 and CS12 are connected in common to the string selection line SSL1, and string selection transistors SST in the cell strings CS21 and CS22 are connected in common to the string selection line SSL2.

Columns of the cell strings CS11, CS21, CS12, and CS22 are connected to different bit lines BL1 and BL2, respectively. For example, the string selection transistors SST in the cell strings CS11 and CS21 may be connected in common to the bit line BL1, and the string selection transistors SST in the cell strings CS12 to CS22 may be connected in common to the bit line BL2.

At least two rows of cell strings are connected in common to a ground selection line GSL. For example, ground selection transistors GST of the cell strings CS11, CS21, CS12, and CS22 may be connected in common to the ground selection line GSL.

Memory cells at the same height from a substrate (or, ground selection transistors GST) are connected in common to a word line, and memory cells at different heights may be connected to different word lines WL1 to WL6.

For example, memory cells MC1 may be connected in common to a word line WL1, and memory cells MC2 may be connected in common to a word line WL2. Memory cells MC3 may be connected in common to a word line WL3, and memory cells MC4 may be connected in common to a word line WL4. Memory cells MC5 may be connected in common to a word line WL5, and memory cells MC6 may be connected in common to a word line WL6.

In one embodiment, the ground selection transistors GST of the cell strings CS11, CS21, CS12, and CS22 are connected in common to a common source line CSL. As such, one end of a string may be connected to a common source line, and another end of the string may be connected to a bit line.

The memory block BLKa illustrated in FIG. 2 is exemplary, and the inventive concept is not limited thereto. For example, the number of rows of cell strings may increase or decrease. As the number of rows of cell strings is varied, the number of string selection lines or the number of ground selection lines connected to rows of cell strings and the number of cell strings connected to a bit line may be also changed.

The number of columns of cell strings may increase or decrease. As the number of columns of cell strings is varied, the number of bit lines connected to columns of cell strings and the number of cell strings connected to a string selection line may be also changed.

The height of cell strings may increase or decrease. For example, the number of stacked memory cells in each cell string may increase or decrease. In this case, the number of word lines may be also changed. For example, the number of ground or string selection transistors in each cell string may increase. In this case, the number of ground or string selection lines may be also changed. If the number of ground or string selection transistors increases, ground or string selection transistors may be stacked substantially the same as the manner in which the memory cells are stacked.

In example embodiments, a read operation and a write operation are performed by a unit of a row of cell strings. The cell strings CS11, CS21, CS12, and CS22 may be selected by a row unit by the string selection lines SSL1 and SSL2.

In a selected row of cell strings, the read operation and the write operation may be performed by a page unit. A page may be, for example, a row of memory cells connected to a word line. In a selected row of cell strings, memory cells may be selected by the word lines WL1 to WL6 by a page unit.

Figure 3:
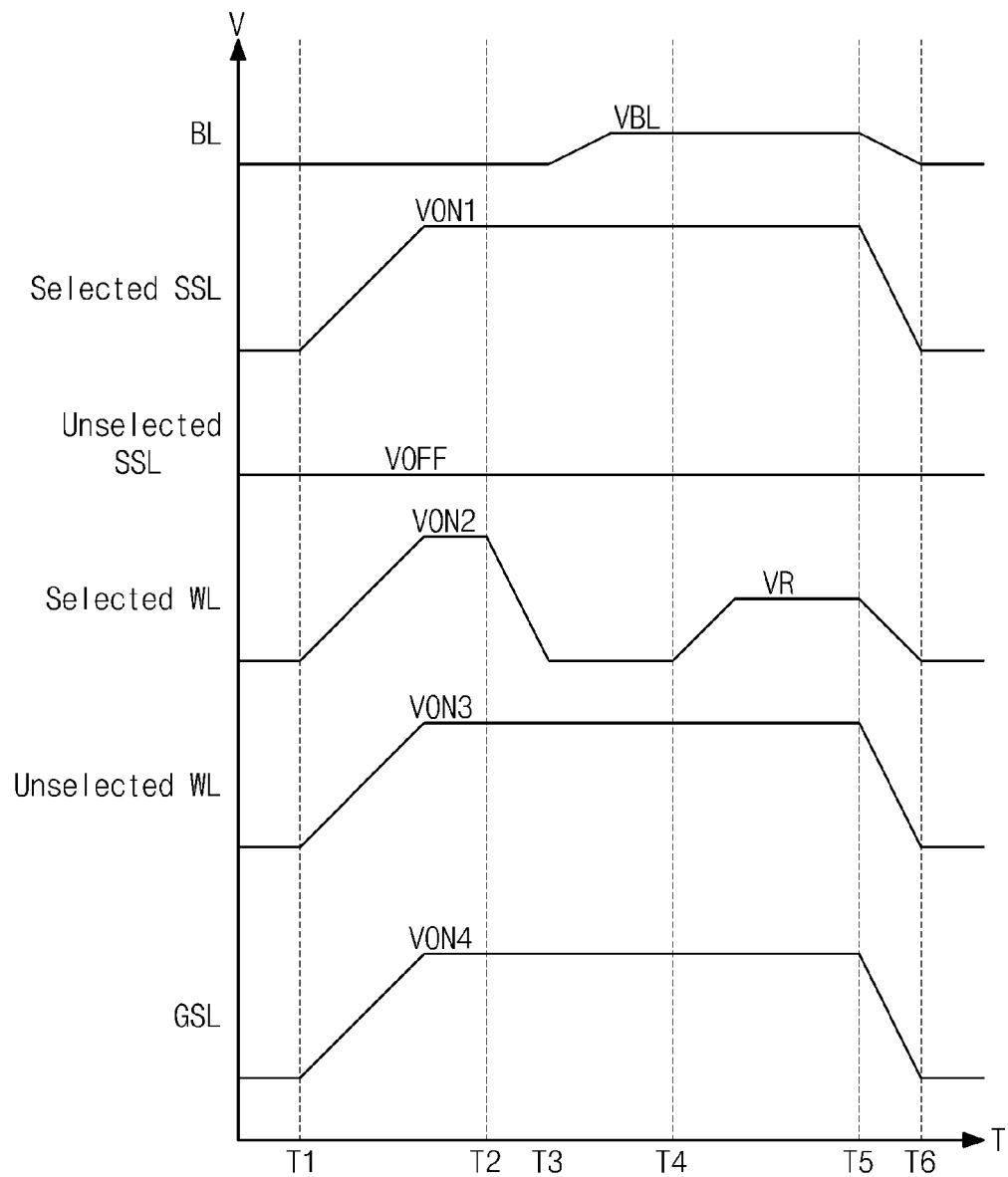
FIG. 3 is a timing diagram schematically illustrating voltages applied to cell strings during a read operation, according to one exemplary embodiment.

FIG. 3 is a timing diagram schematically illustrating voltages applied to cell strings CS11, CS21, CS12, and CS22 during a read operation, according to an exemplary embodiment. Referring to FIGS. 2 and 3, at T1, a first turn-on voltage VON1 may be applied to a selected string selection line. The first turn-on voltage VON1 may be for example a high voltage. Or, the first turn-on voltage VON1 may be a read voltage VREAD having a voltage level sufficient to turn memory cells MC1 to MC6 on regardless of threshold voltages of the memory cells MC1 to MC6.

A turn-off voltage VOFF may be applied to an unselected string selection line. The turn-off voltage VOFF may be, for example, a ground voltage VSS.

A second turn-on voltage VON2 may be applied to a selected word line. The second turn-on voltage VON2 may be, for example, the read voltage VREAD. The second turn-on voltage VON2 may alternatively be a high voltage the level of which is lower than that of the read voltage VREAD.

A third turn-on voltage VON3 may be applied to unselected word lines. The third turn-on voltage VON3 may be, for example, the read voltage VREAD.

A fourth turn-on voltage VON4 may be applied to a ground selection line GSL. The fourth turn-on voltage VON4 may be, for example, the read voltage VREAD.

At T2, the ground voltage VSS, for example, may be applied to a selected word line.

At T3, a bit line voltage VBL may be applied to bit lines BL1 and BL2. The bit line voltage VBL may be, for example, a positive voltage. In one embodiment, the bit line voltage VBL is a power supply voltage VCC.

At T4, a read voltage VR may be applied to the selected word line. The read voltage VR may have a level within threshold voltage distribution ranges of the memory cells MC1 to MC6.

Between T5 and T6, voltages of string selection lines SSL1 and SSL2, word lines WL1 to WL6 and a ground selection line GSL may be discharged. For example, the ground voltage VSS may be applied to the string selection lines SSL1 and SSL2, the word lines WL1 to WL6 and the ground selection line GSL. An interval where voltages of the string selection lines SSL1 and SSL2, the word lines WL1 to WL6 and the ground selection line GSL are discharged may be a recovery interval after a read operation is performed.

In exemplary embodiments, the second turn-on voltage VON2 applied to the selected word line may be a pre-pulse. The pre-pulse may be a voltage for uniformly adjusting potentials of channels of cell strings CS11, CS12, CS21, and CS22 before a read operation is performed. In some embodiments, the pre-pulse may be skipped. For example, the read voltage VR may be applied to the selected word line without applying the second turn-on voltage VON2. In exemplary embodiments, the read voltage VR is applied to the selected word line without discharging of the selected word line after the second turn-on voltage VON2 is applied.

Figure 4:
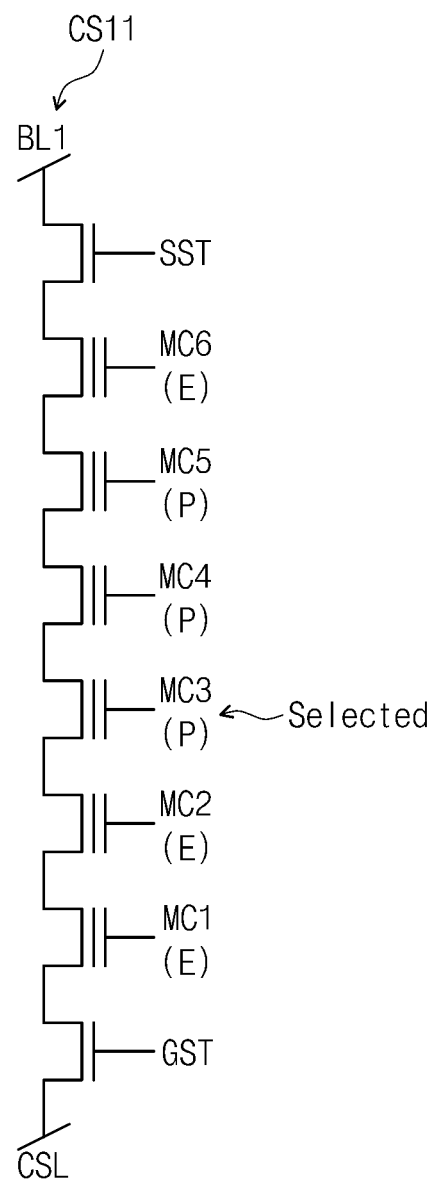
FIG. 4 is a diagram schematically illustrating a cell string selected during a read operation based on timing of FIG. 3, according to one exemplary embodiment.

FIG. 4 is a diagram schematically illustrating a cell string selected during a read operation based on timing of FIG. 3. In FIG. 4, a cell string CS11 is illustrated. Memory cells MC1, MC2, and MC6 may have an erase state E, and memory cells MC3 to MC5 may have a program state P. The memory cell MC3 may be a memory cell selected for reading. Threshold voltages of the memory cells MC3 to MC5 programmed may be higher than those of the memory cells MC1, MC2, and MC6 each having the erase state E. Voltages for turn-on and turn-off switching operations on the memory cells MC3 to MC5 programmed may be higher than those on the memory cells MC1, MC2, and MC6 each having the erase state E.

In exemplary embodiments, the memory cell MC3 may be a memory cell selected for reading.

Figure 5:
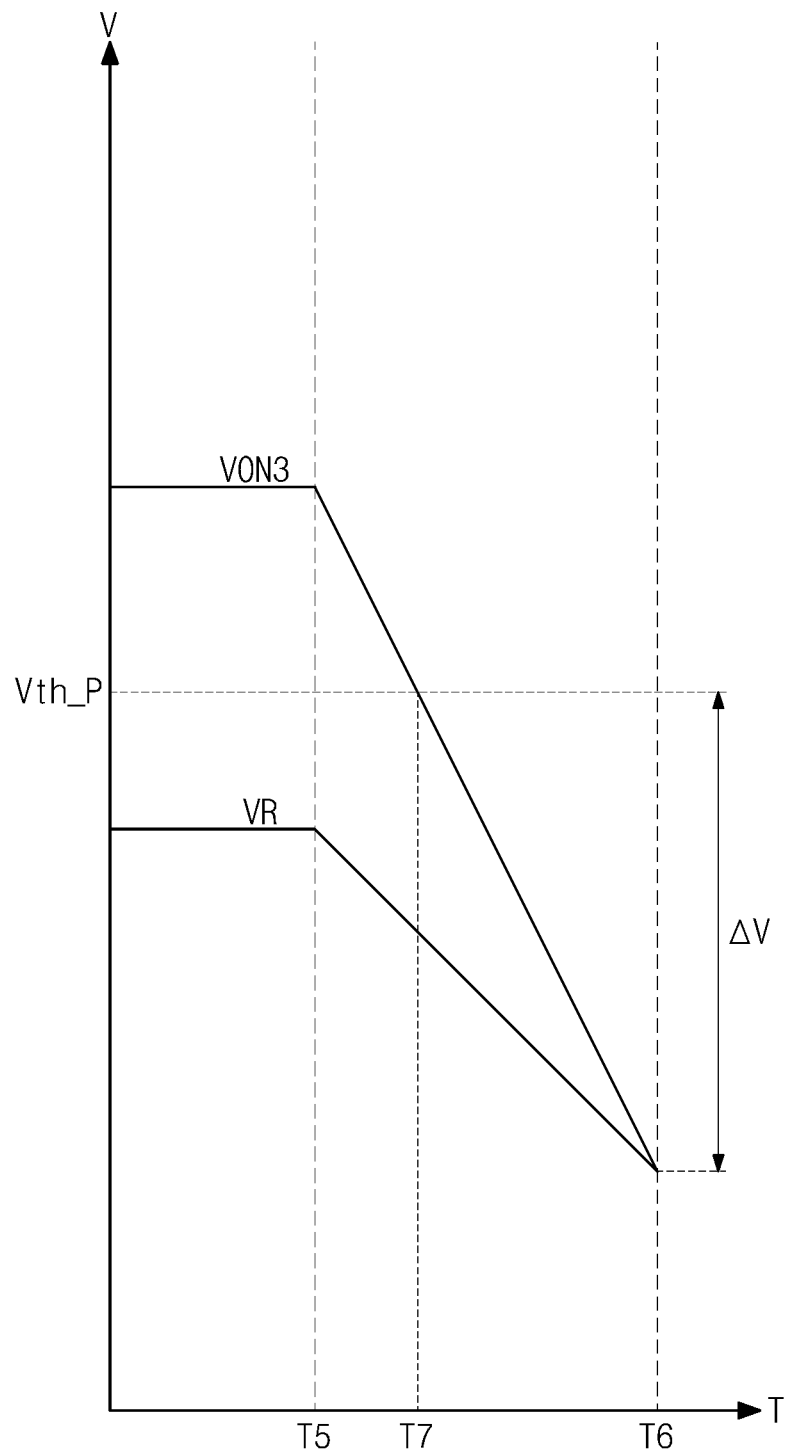
FIG. 5 is a detailed timing diagram of a recovery interval of FIG. 3, according to one exemplary embodiment.

FIG. 5 is a detailed timing diagram of a recovery interval of FIG. 3, according to one exemplary embodiment. Referring to FIGS. 4 and 5, at T5, a third turn-on voltage VON3 applied to unselected word lines WL1, WL2 and WL4 to WL6 and a read voltage VR applied to a selected word line WL3 may start to be discharged to a ground voltage VSS.

In exemplary embodiments, programmed memory cells MC3 to MC5 may have threshold voltages of "Vth_P". During a recovery interval, a selected memory cell MC3 may maintain a turn-off state. After T7 when the third turn-on voltage VON3 is lower than the threshold voltage Vth_P, the memory cells MC4 and MC5 may be turned off. Memory cells MC1, MC2, and MC6 each having an erase state may maintain a turn-on state.

The memory cells MC1 to MC6 stacked in a direction perpendicular to a substrate may have channels having a thin film shape. Channels of the memory cells MC1 to MC6 may be connected to the substrate through a ground selection transistor GST, and not directly connected to the substrate. Thus, when the memory cells MC3 to MC5 are turned off, the channels of the memory cells MC3 to MC5 may be electrically isolated from those of the memory cells MC1, MC2, and MC6. As such, the channels of the memory cells MC3 to MC5 may be electrically floated.

Between T7 and T6, the third turn-on voltage VON3 applied to the unselected memory cells MC4 and MC5 may be lowered by a voltage difference ΔV. The channels of the floated memory cells MC3 to MC5 may be boosted by the voltage difference ΔV in a negative direction.

Figure 6:
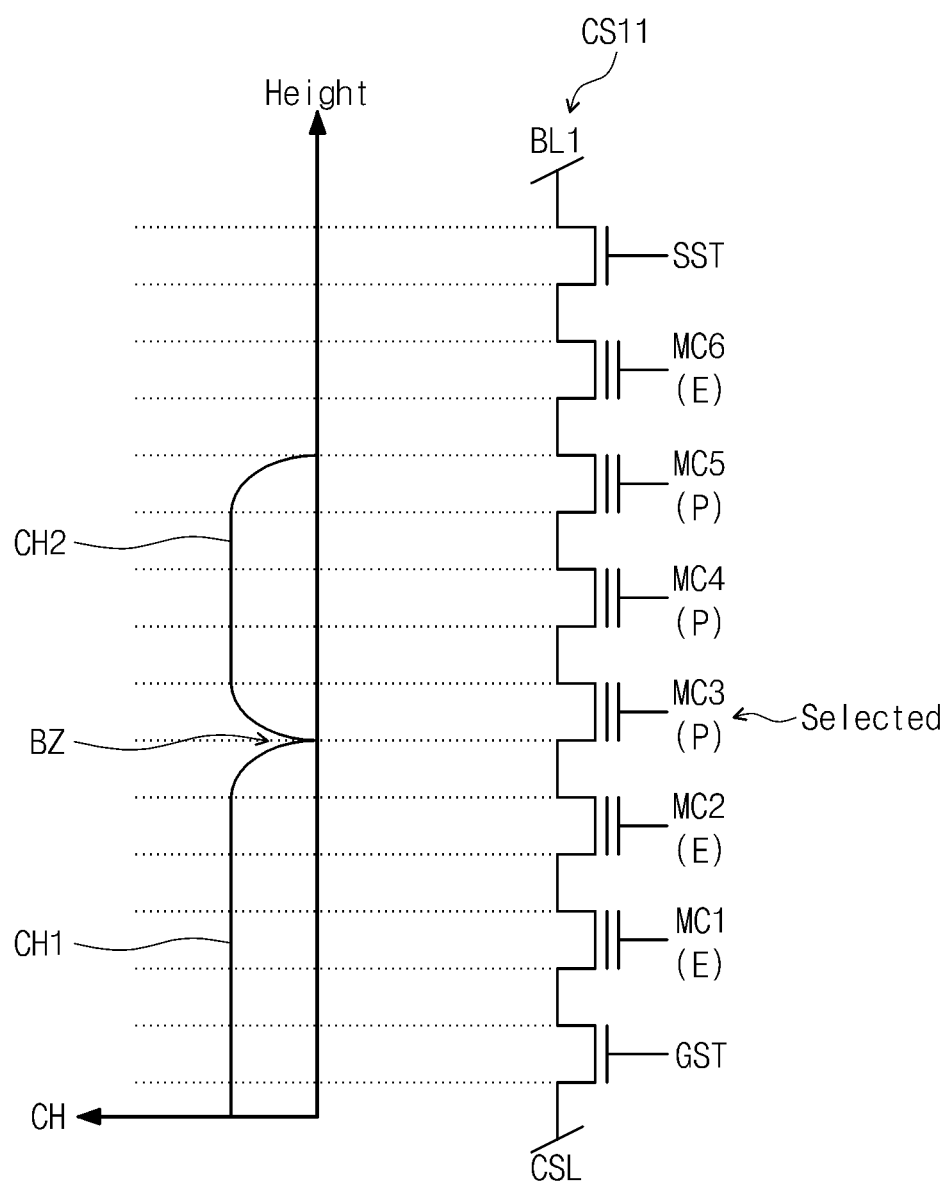
FIG. 6 is a diagram schematically illustrating a channel state of a cell string during T7, according to one exemplary embodiment.

FIG. 6 is a diagram schematically illustrating a channel state of a cell string CS11 during T7, according to one exemplary embodiment. Referring to FIGS. 5 and 6, a first channel CH1 may be formed with a ground selection transistor GST and memory cells MC1 and MC2 being turned on.

A second channel CH2 may be formed with memory cells MC3 to MC5 being turned off.

A low voltage or a ground voltage VSS may be supplied to the first channel CH1 from a common source line CSL. Thus, between T7 and T6, a potential of the first channel CH1 may maintain the low voltage or the ground voltage VSS.

The second channel CH2 may be at a floating state. Thus, between T7 and T6, a potential of the second channel CH2 may be boosted in a negative voltage.

A boundary zone BZ may be between the first channel CH1 and the second channel CH2. A strong electric field may be generated at the boundary zone BZ by a potential difference between the first channel CH1 and the second channel CH2. Hot electrons may be generated by the electric field generated at the boundary zone BZ. The hot electrons generated may be injected into adjacent memory cells MC2 and MC3 to the boundary zone BZ, so that threshold voltages of the memory cells MC2 and MC3 are varied. As a result, read disturbance may be generated.

Figure 7:
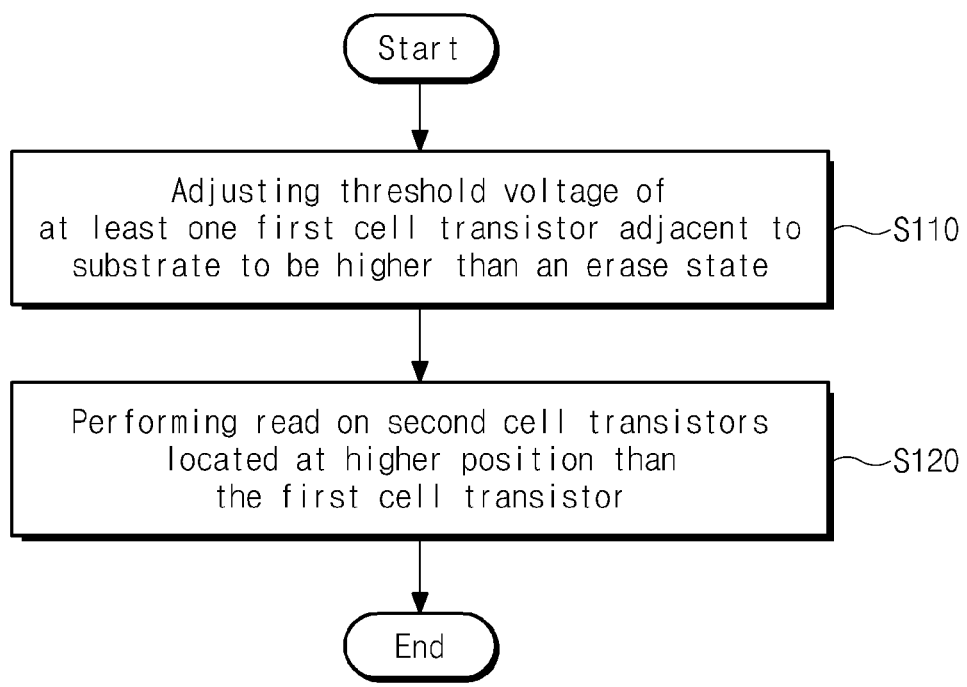
FIG. 7 is a flow chart schematically illustrating an operating method of a nonvolatile memory device 100 according to one exemplary embodiment.

FIG. 7 is a flow chart schematically illustrating an operating method of a nonvolatile memory device 100 according to one exemplary embodiment.

Referring to FIGS. 1 and 7, in step S110, a threshold voltage of at least one first cell transistor adjacent to a substrate may be adjusted to be higher than that corresponding to an erase state. For example, the first cell transistor may be a cell transistor in which data received from an external device is not stored. The first cell transistor may include, for example, a ground selection transistor or a dummy memory cell. A threshold voltage of the first cell transistor may be adjusted through a program operation. In one embodiment, the first cell transistor may be programmed to have one of the programmable states of memory cells MC1 to MC6. Thereafter, because the ground selection transistor or dummy memory cell do not store data intended for later retrieval or reading, the first cell transistor remains at the selected programmed state. At times, a threshold level of the first cell transistor may decrease without being programmed, e.g., due to activity in other portions of the memory block. A method for addressing this issue is described further below, in connection with FIG. 19.

In step S120, a read operation on second cell transistors that are located at a higher position than the first cell transistor is performed.

Figure 8:
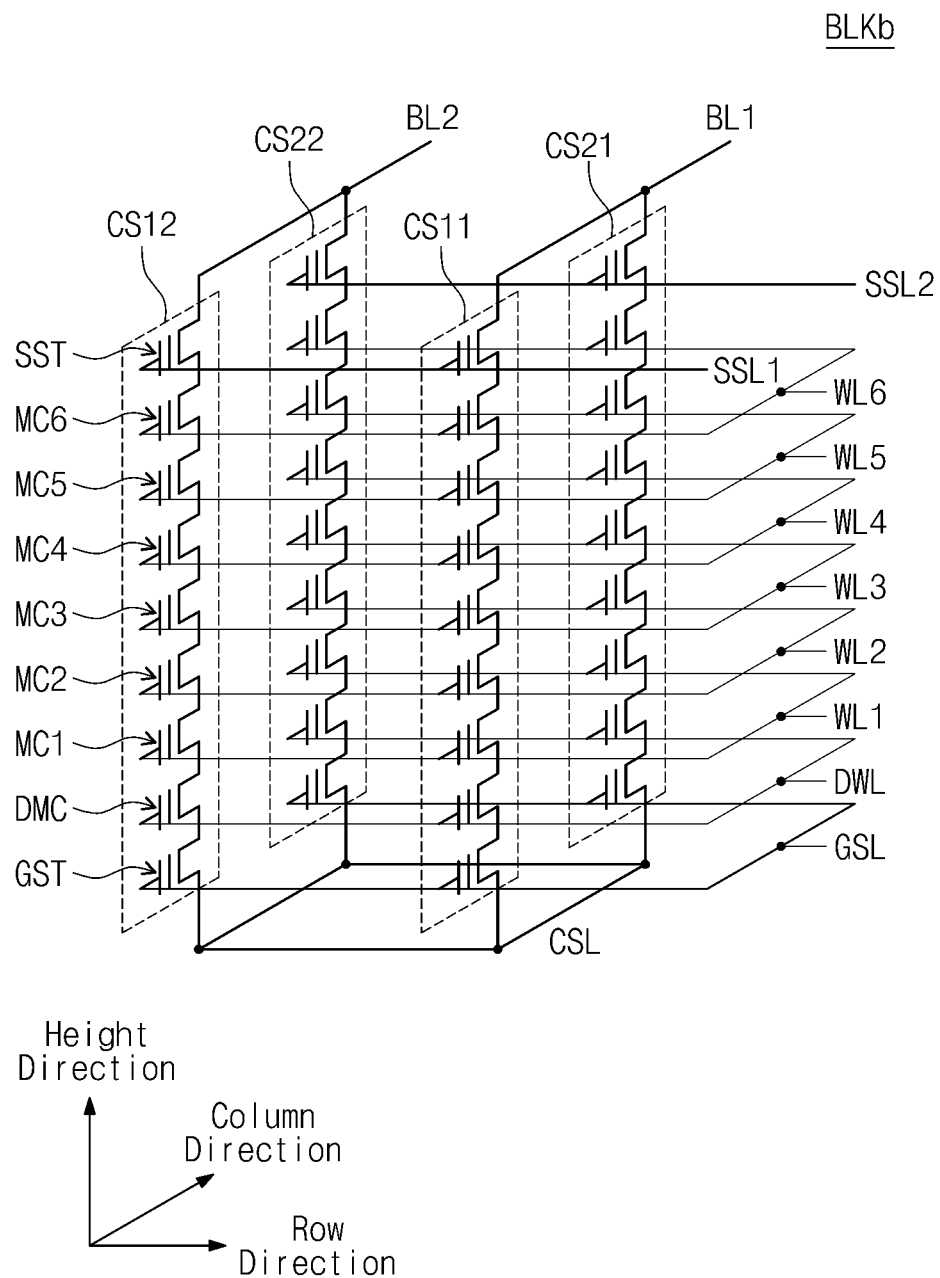
FIG. 8 is a circuit diagram schematically illustrating a memory block according to another exemplary embodiment.

FIG. 8 is a circuit diagram schematically illustrating a memory block BLKb according to another embodiment. In FIG. 8, each cell string may be substantially the same as that of FIG. 2 except that a dummy memory cell DMC is provided between memory cells MC1 to MC6 and a ground selection transistor GST. In FIG. 8, there is illustrated an embodiment where each cell string includes a dummy memory cell DMC. However, the inventive concept is not limited thereto. For example, each cell string may include two or more dummy memory cells. Like the memory cells MC1 to MC6, the dummy memory cells may be stacked in a direction perpendicular to a substrate.

As described with reference to FIG. 7, threshold voltages of the dummy memory cells DMC may be adjusted to be higher than a threshold voltage corresponding to an erase state. For example, the dummy memory cells DMC may be programmed to have a threshold voltage higher than that corresponding to the erase state. In exemplary embodiments, the dummy memory cells DMC may be programmed to have a threshold voltage corresponding to the uppermost program state of program states the memory cells MC1 to MC6 have.

Figure 9:
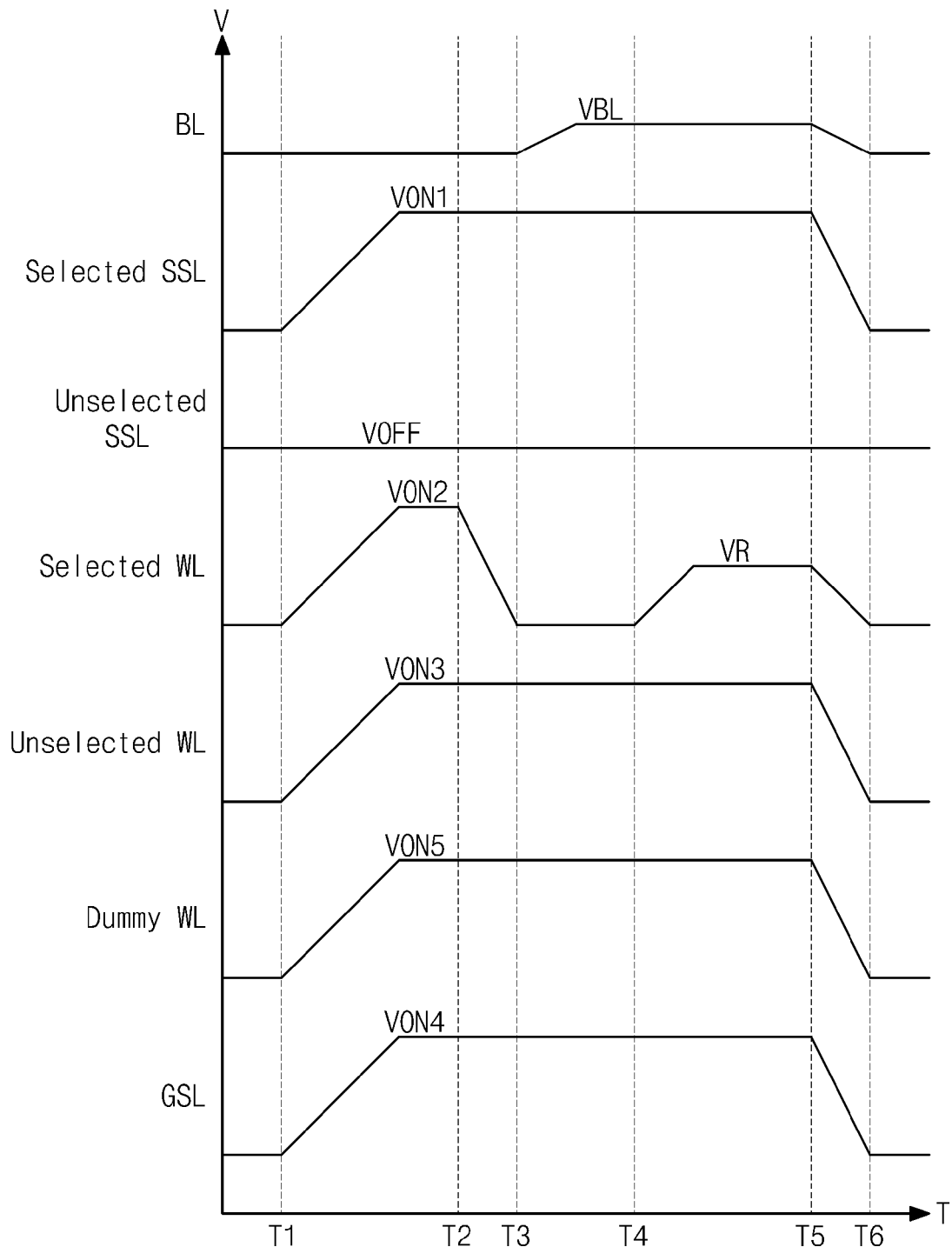
FIG. 9 is a timing diagram schematically illustrating voltages applied to cell strings during a read operation, according to another exemplary embodiment.

FIG. 9 is a timing diagram schematically illustrating voltages applied to cell strings during a read operation, according to another embodiment. A timing diagram of FIG. 9 may be different from that of FIG. 3 in that there is added a voltage applied to a dummy word line DWL. At T1, a fifth turn-on voltage VON5 may be applied to the dummy word line DWL. The fifth turn-on voltage VON5 may be, for example, a read voltage VREAD or a high voltage lower than the read voltage VREAD.

At T5, a voltage of the dummy word line DWL may be recovered.

Figure 10:
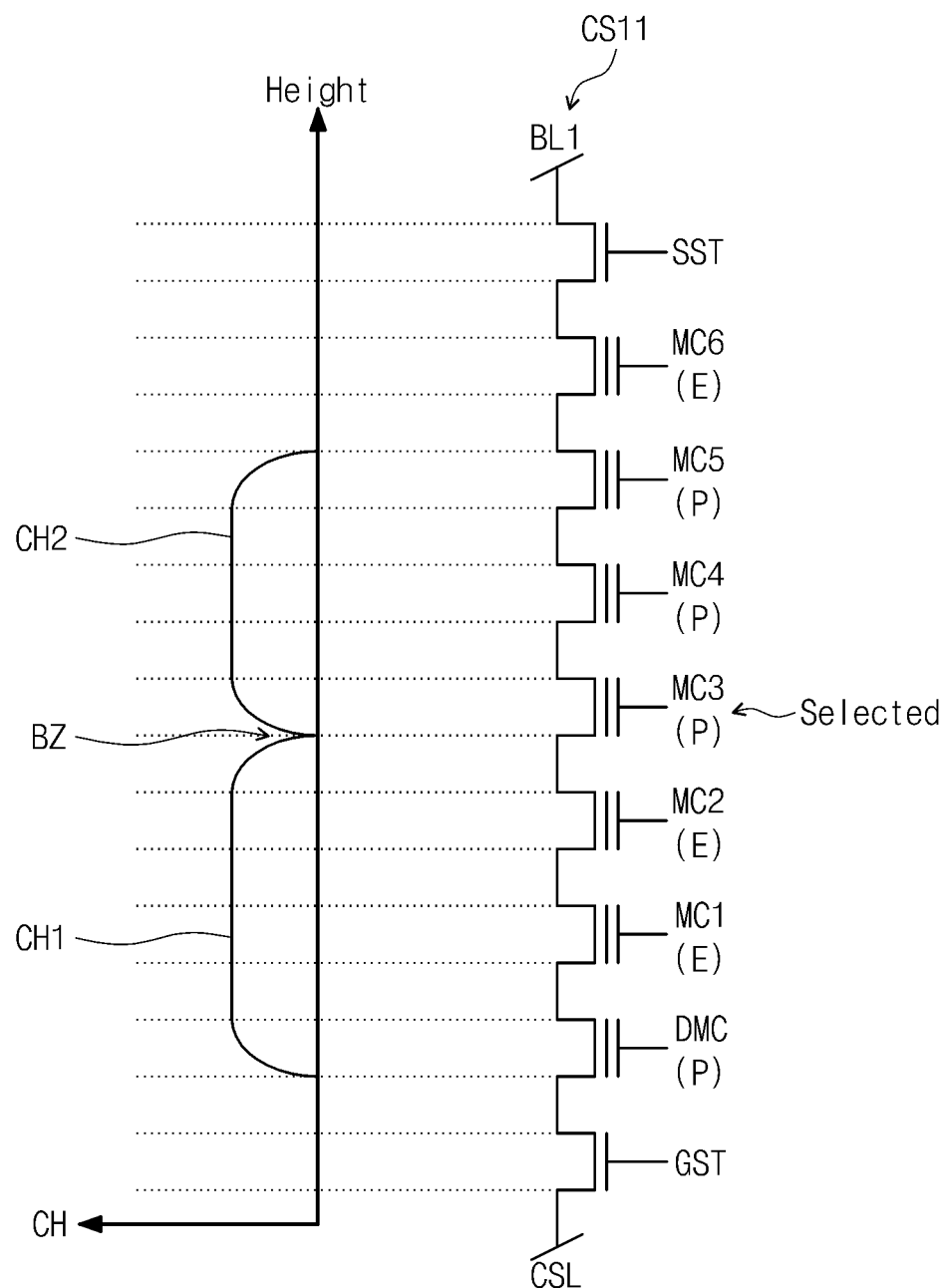
FIG. 10 is diagram schematically illustrating a channel state of a cell string at T7, according to another exemplary embodiment.

FIG. 10 is diagram schematically illustrating a channel state of a cell string CS11 at T7, according to another exemplary embodiment. In FIG. 10, there is illustrated a channel state formed when a dummy memory cell DMC has a higher threshold voltage than that corresponding to an erase state as described with reference to FIGS. 7 to 9.

As compared to a channel state of FIG. 6, at T7, memory cells MC3 to MC5 and the dummy memory cell DMC may be turned off. Since the dummy memory cell DMC is turned off, a first channel CH1 may be electrically isolated from a common source line CSL. Thus, between T7 and T6, a second channel CH2 may be boosted in a negative direction and the first channel CH1 may be also be boosted.

If the first and second channels CH1 and CH2 are boosted together in a negative direction, no potential difference may be generated at a boundary zone BZ. Therefore, hot electrons may not be generated. Thus, it is possible to prevent or reduce read disturbance.

Figure 11:
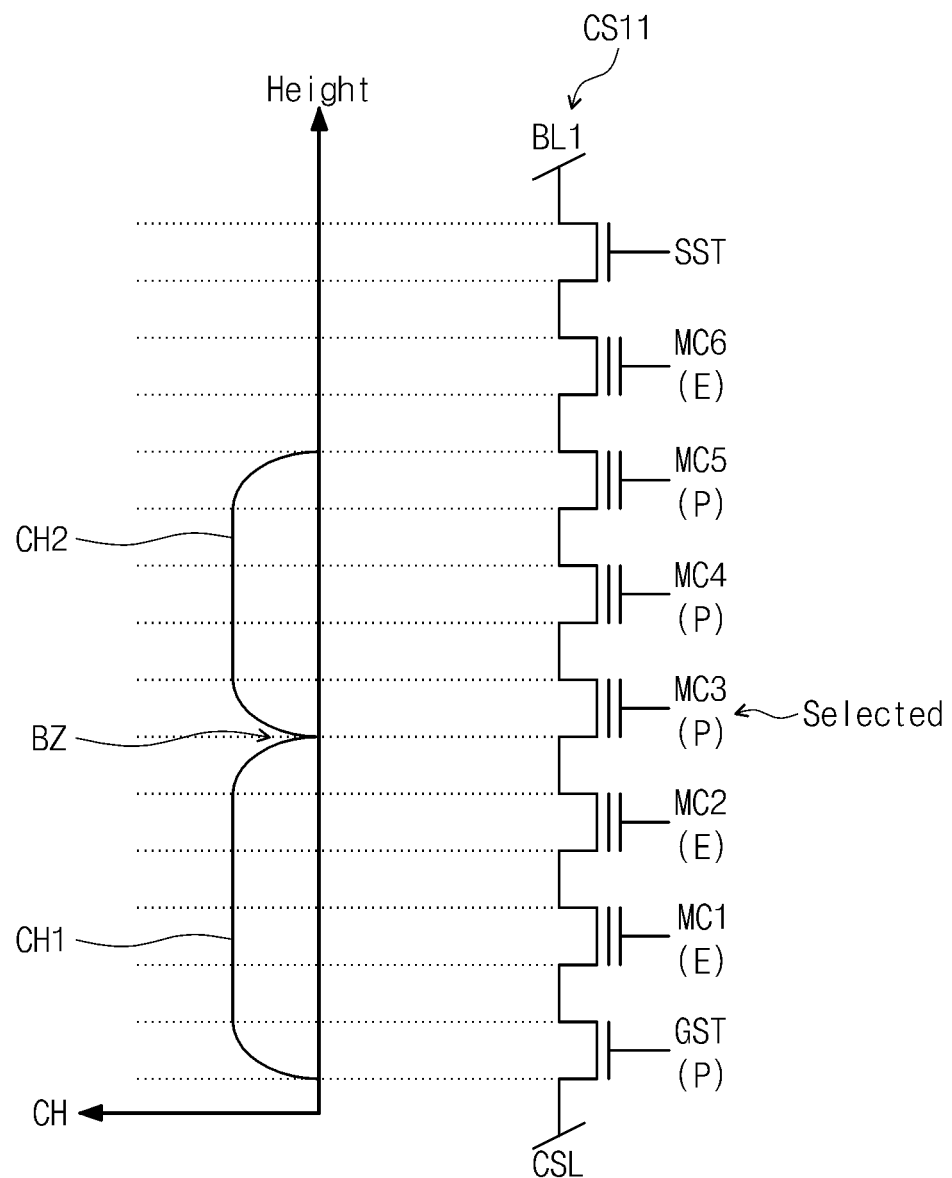
FIG. 11 is diagram schematically illustrating a channel state of a cell string at T7, according to still another exemplary embodiment.

FIG. 11 is diagram schematically illustrating an exemplary channel state of a cell string CS11 at T7, according to still another embodiment. In FIG. 11, there is illustrated a channel state formed when ground selection transistors GST in a memory block BLKa of FIG. 2 have threshold voltages higher than that corresponding to an erase state. For example, the ground selection transistors GST may have threshold voltages corresponding to the uppermost program state of program states of memory cells MC1 to MC6.

As compared to a channel state of FIG. 6, at T7, memory cells MC3 to MC5 and the ground selection transistor GST may be turned off. Since the ground selection transistor GST is turned off, a first channel CH1 may be electrically isolated from a common source line CSL. Thus, between T7 and T6, a second channel CH2 may be boosted in a negative direction and the first channel CH1 may be also boosted.

If the first and second channels CH1 and CH2 are boosted together in a negative direction, no potential difference may be generated at a boundary zone BZ. Therefore, hot electrons may not be generated. Thus, it is possible to prevent or reduce read disturbance.

As described above, each cell string may include memory cells MC1 to MC6 stacked in a direction perpendicular to a substrate. A threshold voltage of a cell transistor (e.g., a dummy memory cell DMC or a ground selection transistor GST) located under the memory cells MC1 to MC6 may be adjusted to be higher than that corresponding to an erase state. Thus, it is possible to prevent or reduce read disturbance and to improve a reliability of a nonvolatile memory device 100.

In exemplary embodiments, each cell string may be implemented to include both dummy memory cells DMC and ground selection transistors GST. Each of the dummy memory cells DMC and the ground selection transistors GST may have a higher threshold voltage than that corresponding to an erase state. As a result, a first channel CH1 may be electrically and even more strongly isolated from a common source line CSL.

Figure 12:
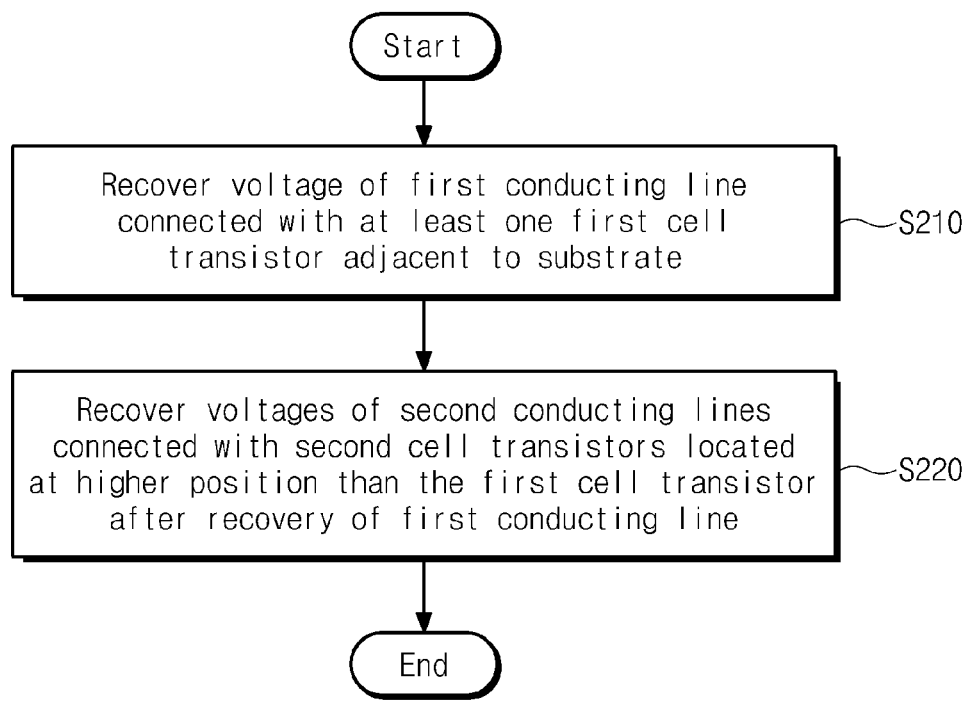
FIG. 12 is a flow chart schematically illustrating an operating method of a nonvolatile memory device 100 according to another exemplary embodiment.

FIG. 12 is a flow chart schematically illustrating an operating method of a nonvolatile memory device 100 according to another exemplary embodiment. Referring to FIGS. 2, 8, and 12, in step S210, a voltage of a first conducting line connected to at least one first cell transistor adjacent to a substrate may be recovered. For example, a voltage of a dummy word line DWL connected to dummy memory cells DMC or a voltage of a ground selection line connected to ground selection transistors GST may be recovered.

In step S220, after a voltage of the first conducting line is recovered, voltages of second conducting lines connected to second cell transistors located above the first cell transistor may be recovered. For example, voltages of word lines WL1 to WL6 connected to memory cells MC1 to MC6 may be recovered.

Figure 13:
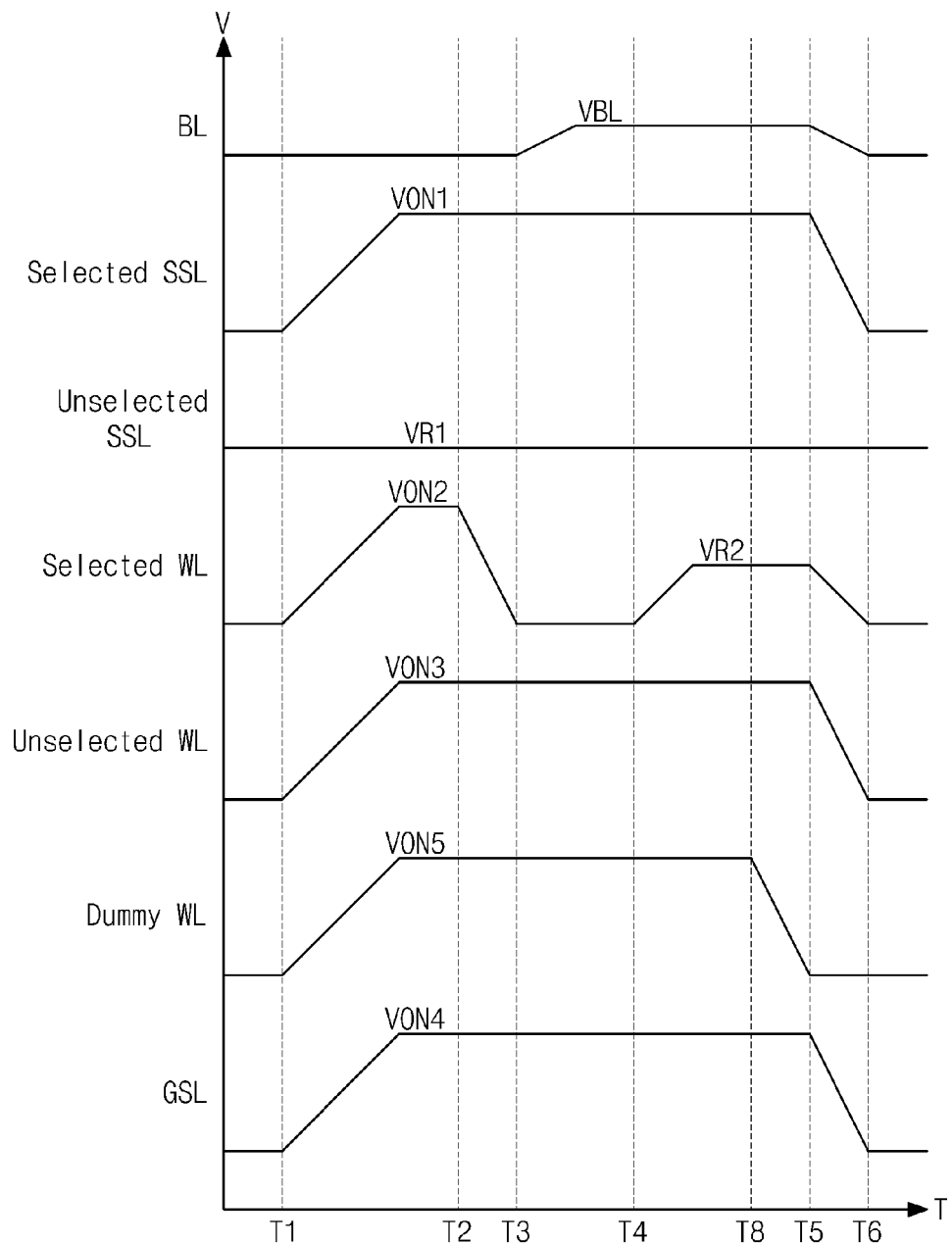
FIG. 13 is a timing diagram schematically illustrating voltages applied to cell strings based on a method of FIG. 12, according to one exemplary embodiment.

FIG. 13 is a timing diagram schematically illustrating voltages applied to cell strings CS11, CS21, CS12, and CS22 based on a method of FIG. 12, according to one exemplary embodiment. As compared to a timing diagram of FIG. 9, before T5, for example, at T8, a voltage of a dummy word line DWL may be recovered. Afterwards, at T5, voltages of other lines may be recovered as described with reference to FIG. 9.

If a voltage of the dummy word line DWL is recovered prior to voltages of unselected word lines, dummy memory cells DMC may be turned off before unselected memory cells are turned off. When the dummy memory cells DMC are first turned off, as illustrated in FIG. 10, a first channel CH1 may be floated before voltages of the unselected word lines are recovered. Thus, the first channel may be boosted more in a negative direction and generation of hot electrons at a boundary zone BZ may be more readily prevented.

In exemplary embodiments, in the event that a voltage of the dummy word line DWL is recovered before voltages of unselected word lines are recovered, threshold voltages of dummy memory cells DMC may be adjusted. For example, threshold voltages of the dummy memory cells DMC may be higher than a threshold voltage corresponding to an erase state (or, a ground voltage VSS). Threshold voltages of the dummy memory cells DMC may not be limited to the highest threshold voltage of threshold voltages of memory cells MC1 to MC6, however. Thus, threshold voltage of the dummy memory cells DMC may be adjusted to have a level optimized to an operating characteristic of a nonvolatile memory 100. This may cause operating characteristics of the nonvolatile memory 100 to be improved.

Figure 14:
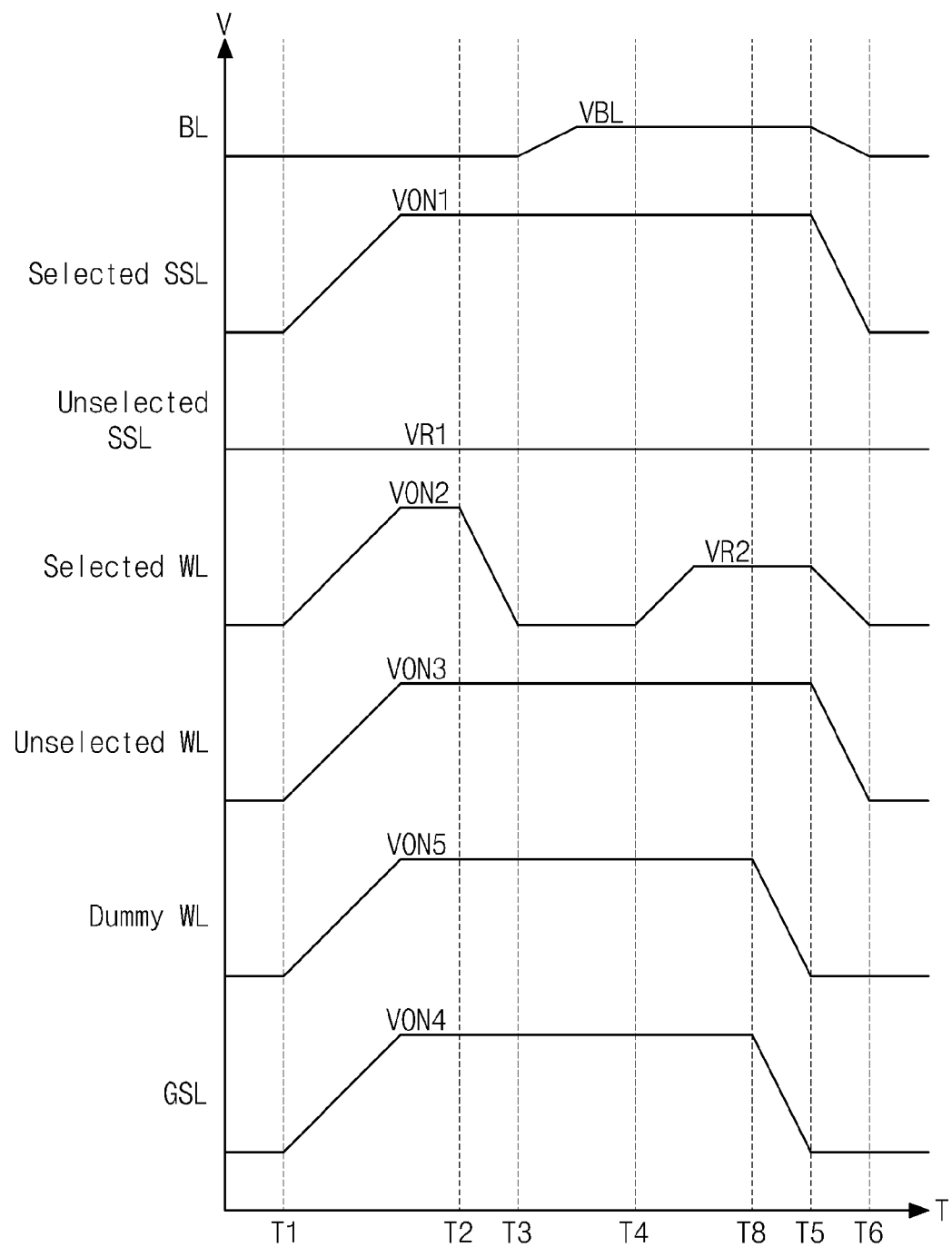
FIG. 14 is a timing diagram schematically illustrating voltages applied to cell strings based on a method of FIG. 12, according to another exemplary embodiment.

FIG. 14 is a timing diagram schematically illustrating voltages applied to cell strings CS11, CS21, CS12, and CS22 based on a method of FIG. 12, according to another exemplary embodiment. As compared to a timing diagram of FIG. 13, before T5, for example, at T8, a voltage of a dummy word line DWL and a voltage of a ground selection line GSL may be first recovered. Afterwards, at T5, voltages of other lines may be recovered as described with reference to FIG. 9.

Figure 15:
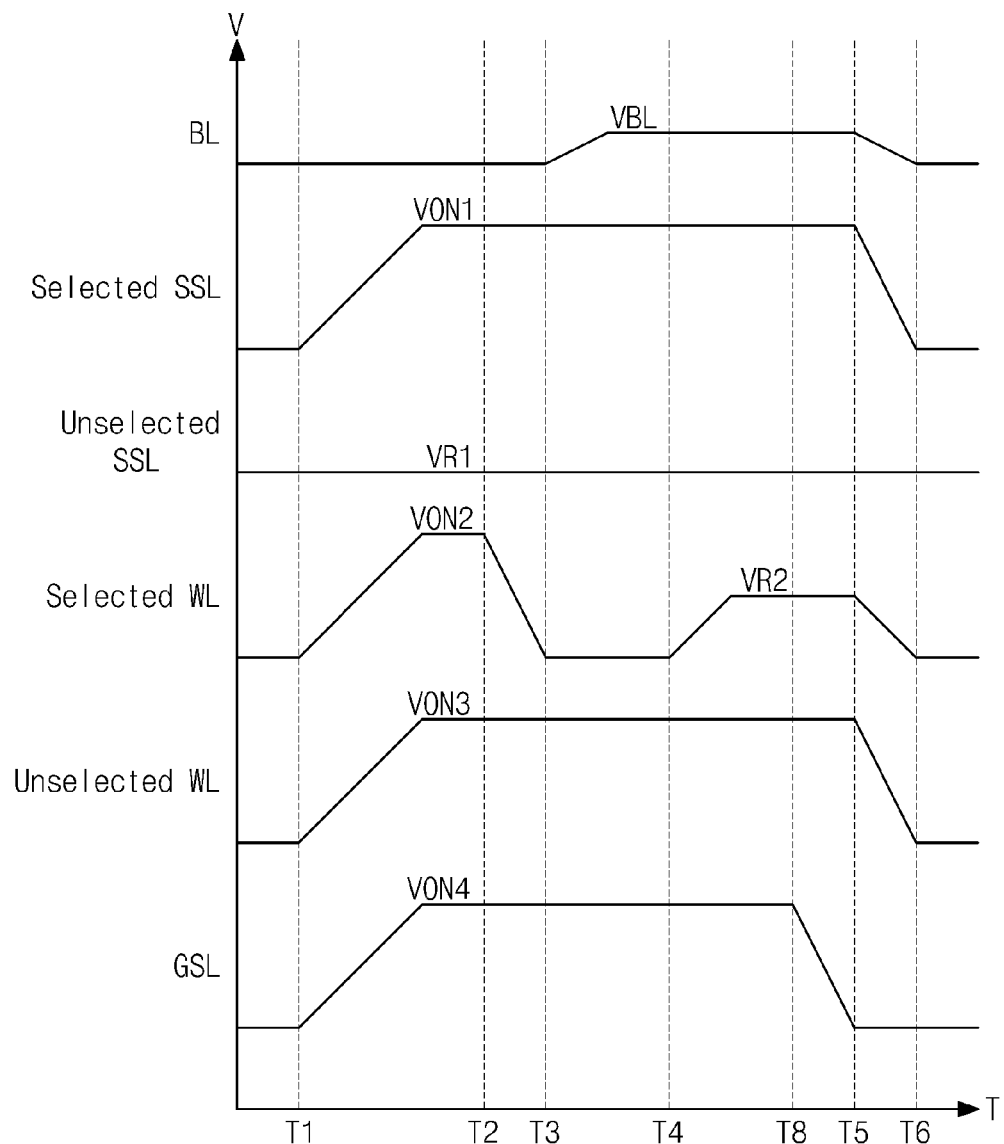
FIG. 15 is a timing diagram schematically illustrating voltages applied to cell strings based on a method of FIG. 12, according to still another exemplary embodiment.

FIG. 15 is a timing diagram schematically illustrating voltages applied to cell strings CS11, CS21, CS12, and CS22 based on a method of FIG. 12, according to still another exemplary embodiment. As compared to a timing diagram of FIG. 3, before T5, for example, at T8, a voltage of a ground selection line GSL may be first recovered. Afterwards, at T5, voltages of other lines may be recovered as described with reference to FIG. 3.

Figure 16:
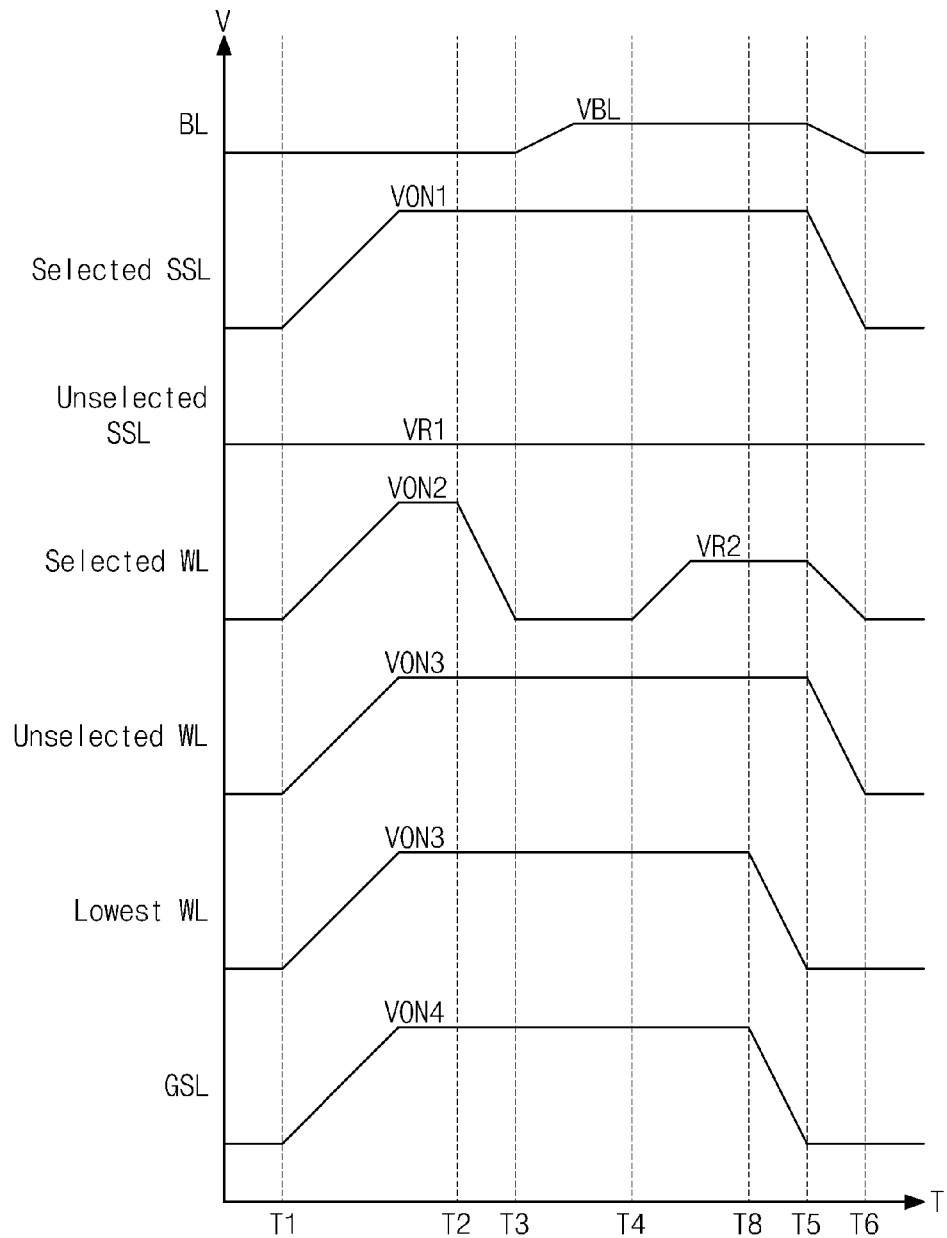
FIG. 16 is a timing diagram schematically illustrating voltages applied to cell strings based on a method of FIG. 12, according to a further exemplary embodiment.

FIG. 16 is a timing diagram schematically illustrating voltages applied to cell strings CS11, CS21, CS12, and CS22 based on a method of FIG. 12, according to a further exemplary embodiment. As compared to a timing diagram of FIG. 16, before T5, for example, at T8, a voltage of a ground selection line GSL may be first recovered. Also, voltages of certain word lines, located below a selected word line, from among word lines WL1 to WL6 may be first recovered. For example, a voltage of the lowermost word line WL1 of the word lines WL1 to WL6 may be recovered.

In the event that memory cells MC1 connected to the word line WL1 are at a program state, a first channel CH1 may be isolated from a common source line CSL by the memory cells MC1.

Figure 17:
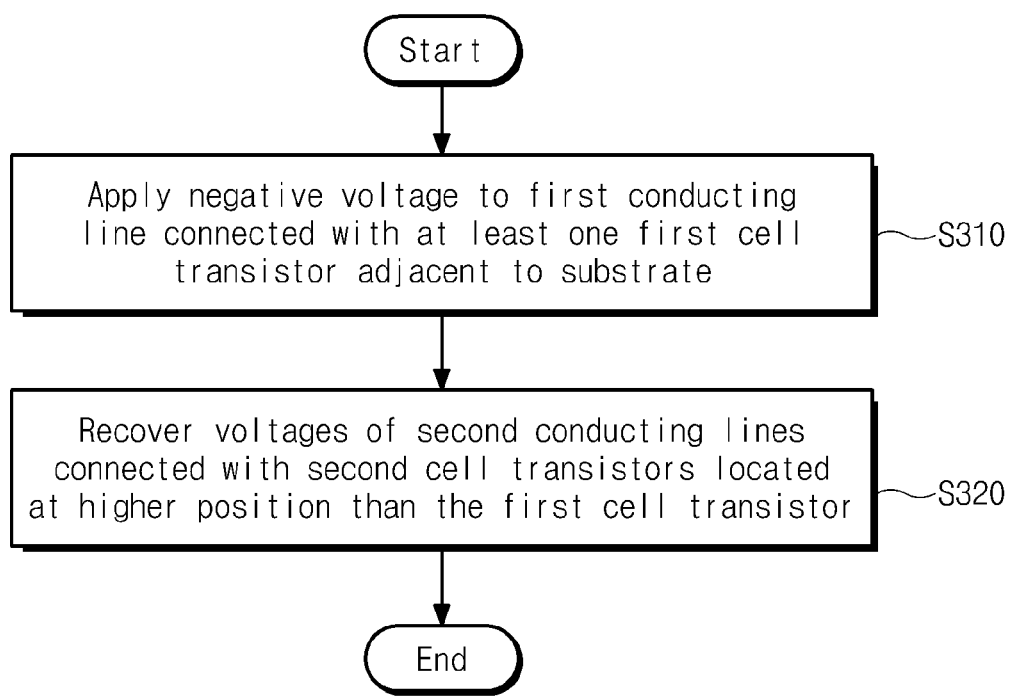
FIG. 17 is a flow chart schematically illustrating an operating method of a nonvolatile memory according to still another exemplary embodiment.

FIG. 17 is a flow chart schematically illustrating an operating method of a nonvolatile memory 100 according to still another exemplary embodiment. Referring to FIGS. 2, 8, and 17, in step S310, a negative voltage may be applied to a first conducting line connected to at least one first cell transistor adjacent to a substrate. For example, a negative voltage may be applied to a dummy word line DWL connected to dummy memory cells DMC or to a ground selection line connected to ground selection transistors GST.

In step S320, voltages of second conducting lines connected to second cell transistors located above the first cell transistor may be recovered. For example, voltages of word lines WL1 to WL6 connected to memory cells MC1 to MC6 may be recovered.

In FIGS. 13 to 18, there are described embodiments in which after a voltage of a conducting line recovered at T8 is recovered to a ground voltage VSS, voltages of other lines are recovered at T6. However, voltages of at least some of the other lines can be recovered before a voltage of a conducting line recovered at T8 is recovered.

Figure 18:
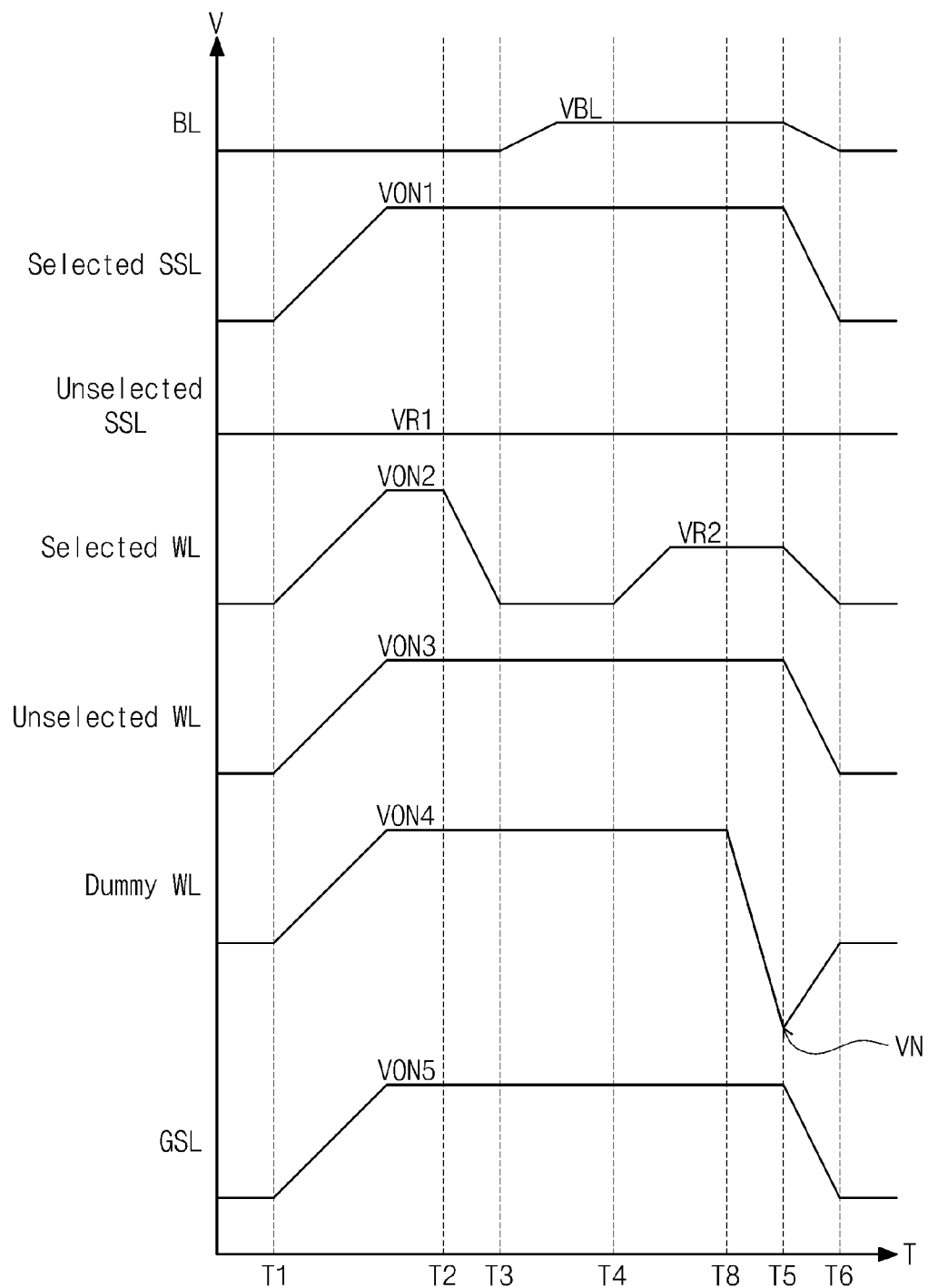
FIG. 18 is a timing diagram schematically illustrating voltages applied to cell strings based on a method of FIG. 17, according to one exemplary embodiment.

FIG. 18 is a timing diagram schematically illustrating voltages applied to cell strings CS11, CS21, CS12, and CS22 based on a method of FIG. 17, according to one exemplary embodiment. As compared to a timing diagram of FIG. 13, before T5, for example, at T8, a negative voltage VN is applied to a dummy word line DWL. Afterwards, at T5, voltages of other lines may be recovered as described with reference to FIG. 9.

If a negative voltage is applied to the dummy word line DWL, dummy memory cells DMC may be first turned off. When the dummy memory cells DMC are first turned off, as illustrated in FIG. 10, a first channel CH1 may be floated before voltages of the unselected word lines are recovered. Thus, the first channel may be boosted more in a negative direction and generation of hot electrons at a boundary zone BZ may be better prevented.

In exemplary embodiments, in the event that a negative voltage is applied to the dummy word line DWL, threshold voltages of dummy memory cells DMC may be adjusted. For example, threshold voltages of the dummy memory cells DMC may be higher than a threshold voltage corresponding to an erase state (or, a ground voltage VSS). However, threshold voltages of the dummy memory cells DMC is not limited to the highest threshold voltage of threshold voltages of memory cells MC1 to MC6. Thus, a threshold voltage of the dummy memory cells DMC may be adjusted to have a level optimized to an operating characteristic of a nonvolatile memory 100. This may mean that an operating characteristic of the nonvolatile memory 100 is improved.

In exemplary embodiments, a negative voltage VN may be applied to a ground selection line GSL as described with reference to FIG. 14.

In exemplary embodiments, a negative voltage VN may be applied not to a dummy word line DWL but to a ground selection line GSL as described with reference to FIG. 15.

In exemplary embodiments, a negative voltage VN may be applied to a ground selection line GSL and a lower word line as described with reference to FIG. 16.

Figure 19:
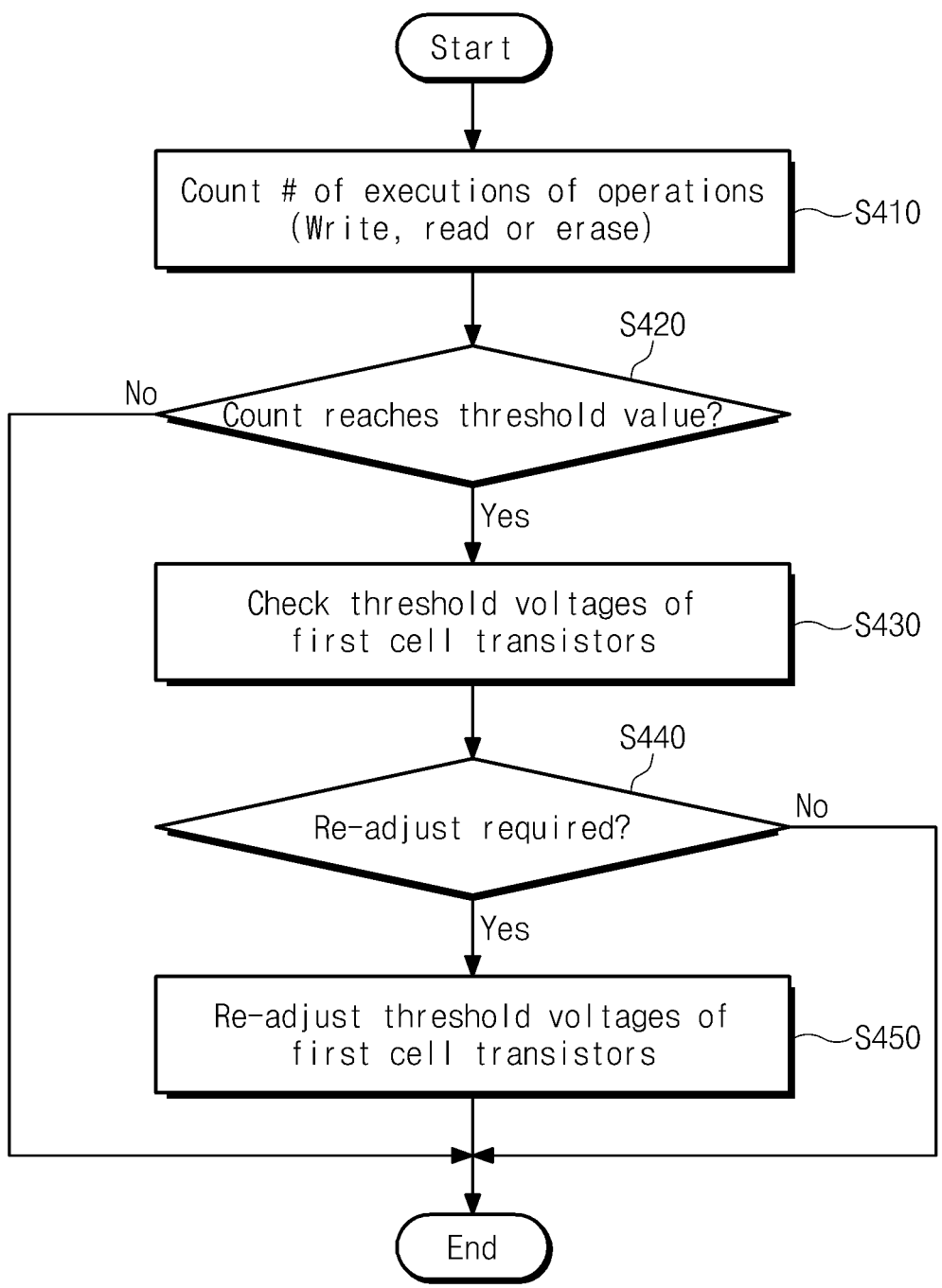
FIG. 19 is a flow chart schematically illustrating an operating method of a nonvolatile memory 100, according to a further exemplary embodiment.

FIG. 19 is a flow chart schematically illustrating an operating method of a nonvolatile memory 100, according to a further exemplary embodiment.

Referring to FIGS. 2, 8, and 19, in step S410, the number of operations executed is counted. For example, the number of read, write or erase operations of a nonvolatile memory 100 may be counted. For example, the number of operations executed with respect to each memory block of the nonvolatile memory 100 may be counted.

In step S420, whether a counted value reaches a threshold value is determined. For example, whether a value counted by a memory block unit reaches the threshold value may be determined. In one embodiment, if the counted value does not reach the threshold value, then no further steps of FIG. 19 are performed. When the counted value reaches the threshold value, however, the method proceeds to step S430.

In step S430, threshold voltages of first cell transistors are checked. For example, in a memory block where a counted value reaches a threshold value, threshold voltages of dummy memory cells or ground selection transistors may be checked. This may be performed, for example, through a read operation.

In step S440, re-adjustment may be needed. For example, re-adjustment may be needed when threshold voltages of dummy memory cells or ground selection transistors are lower than a predetermined value. When re-adjustment is not needed, then the method of FIG. 19 may end. If re-adjustment is required, however, the method may proceed to step S450.

In step S450, threshold voltages of the first cell transistors are adjusted. For example, threshold voltages of the dummy memory cells or the ground selection transistors may be adjusted to be higher than that corresponding to an erase state.

As illustrated in FIG. 19, threshold voltages of the dummy memory cells or the ground selection transistors for isolating a first channel CH1 from a common source line CSL may be iteratively checked and re-adjusted.

In exemplary embodiments, an operating method of FIG. 19 may be performed whenever a nonvolatile memory 100 performs a read, write or erase operation.

In exemplary embodiments, a threshold value used in step S420 may be a fixed value or a variable value. For example, a threshold value may be a value that is randomly generated. In the nonvolatile memory 100, the threshold voltage may be a voltage that gradually decreases according to an increase in the number of operations executed.

Figure 20:
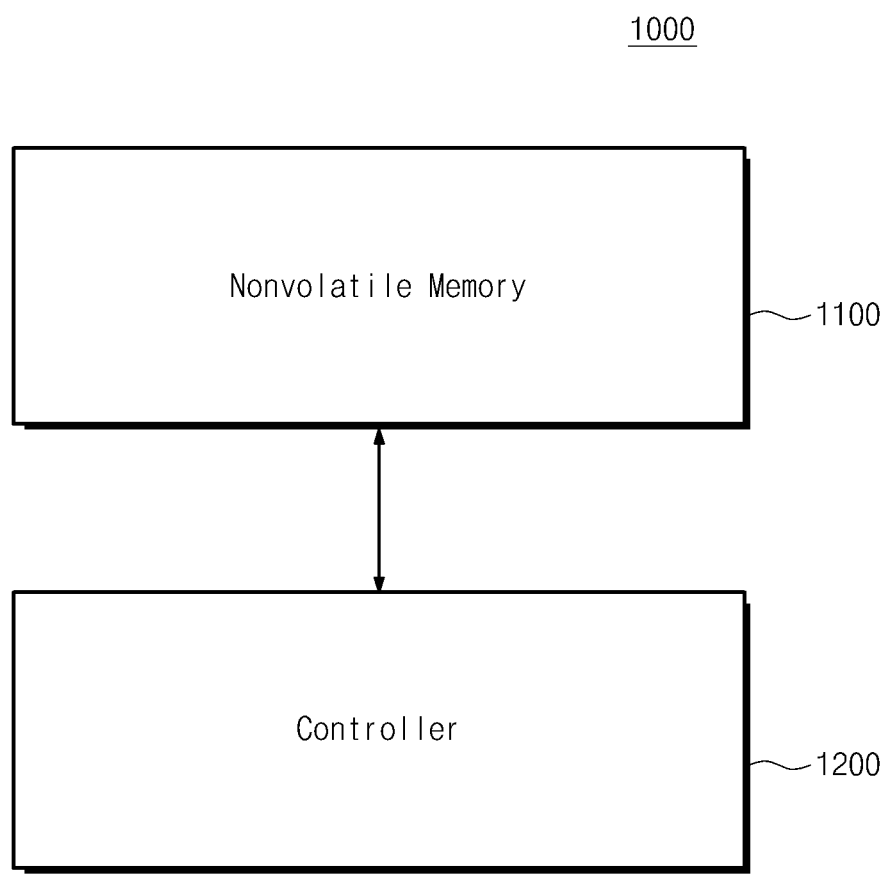
FIG. 20 is a block diagram schematically illustrating a memory system according to one exemplary embodiment.

FIG. 20 is a block diagram schematically illustrating a memory system 1000 according to one embodiment. Referring to FIG. 20, a memory system 1000 includes a nonvolatile memory 1100 and a controller 1200.

In exemplary embodiments, the nonvolatile memory 1100 may be a nonvolatile memory 100 such as described with reference to FIGS. 1 to 19. The nonvolatile memory 1100 may include dummy memory cells or ground selection transistors having threshold voltages higher than a threshold voltage corresponding to an erase state as described with reference to FIGS. 1 to 19. The nonvolatile memory 1100 may first recover a voltage of a dummy word line or a ground selection line prior to voltages of other lines. The nonvolatile memory 1100 may apply a negative voltage to the dummy word line or the ground selection line.

The nonvolatile memory 1100 may include, for example, at least one of nonvolatile memories such as an EPROM (Electrically Erasable and Programmable ROM), a flash memory, a PRAM (Phase-change RAM), an RRAM (Resistive RAM), an FRAM (Ferroelectric RAM), and so on.

The controller 1200 may be connected to the nonvolatile memory 1100. The controller 1200 may be configured to access the nonvolatile memory 1100. For example, the controller 1200 may control an overall operation of the nonvolatile memory 1100 including a read operation, a write operation, an erase operation, a background operation, and so on. The controller 1200 may provide an interface between the nonvolatile memory 1100 and a host. In one example, the controller 1200 may be configured to drive firmware for controlling the nonvolatile memory 1100.

In exemplary embodiments, the controller 1200 may include components such as a RAM, a processing unit, a host interface, a memory interface, an error correction unit, etc.

The controller 1200 may communicate with an external device (e.g., a host) according to a particular communication protocol. For example, the controller 1200 may communicate with the external device through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, and so on.

The controller 1200 and the nonvolatile memory 1100 may be integrated in a single semiconductor device. For example, the controller 1200 and the nonvolatile memory 1100 may be integrated in a single semiconductor device to form a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), a universal flash storage (UFS), and so on.

The controller 1200 and the nonvolatile memory 1100 may be integrated in a single semiconductor device to form a solid state drive (SSD). The SSD may include a storage unit configured to store data in a semiconductor memory. In the event that the memory system 1000 is used as the SSD, the operating speed of the host connected to the memory system 1000 may be improved.

In other exemplary embodiments, the memory system 1000 may be provided as one of various components of an electronic device such as a computer, a ultra-mobile personal computer (UMPC), a workstation, a net-book, a personal digital assistance (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

In exemplary embodiments, the nonvolatile memory 1100 or the memory system 1000 may be implemented using various kinds of packages. For instance, the nonvolatile memory 1100 or the memory system 1000 may be implemented with packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 21:
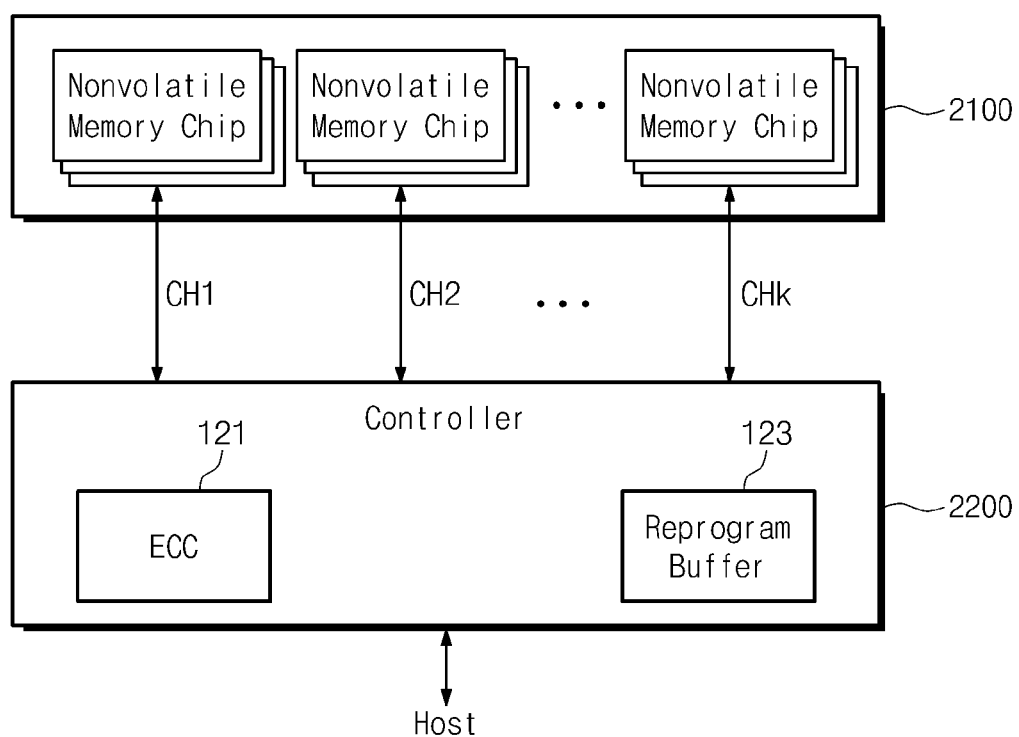
FIG. 21 is a block diagram schematically illustrating a memory system according to a second embodiment of the inventive concept.

FIG. 21 is a block diagram schematically illustrating a memory system 2000 according to another embodiment. Referring to FIG. 21, a memory system 2000 may include a nonvolatile memory 2100 and a controller 2200. The nonvolatile memory 2100 may include a plurality of nonvolatile memory chips, which form a plurality of groups. Nonvolatile memory chips in each group may be configured to communicate with the controller 2200 via one common channel. In exemplary embodiments, the plurality of nonvolatile memory chips may communicate with the controller 2200 via a plurality of channels CH1 to CHk. As shown in FIG. 21, the controller 2200 may include an error correcting code (ECC) component 121 and a reprogram buffer 123.

In exemplary embodiments, the nonvolatile memory 2100 may be a nonvolatile memory 100 described with reference to FIGS. 1 to 19. The nonvolatile memory 2100 may include dummy memory cells or ground selection transistors having threshold voltages higher than a threshold voltage corresponding to an erase state as described with reference to FIGS. 1 to 19. The nonvolatile memory 2100 may first recover a voltage of a dummy word line or a ground selection line prior to voltages of other lines. The nonvolatile memory 2100 may apply a negative voltage to the dummy word line or the ground selection line.

In FIG. 21, there is described an example where one channel is connected to a plurality of nonvolatile memory chips. However, the memory system 2000 can be modified such that one channel is connected to one nonvolatile memory chip.

Figure 22:
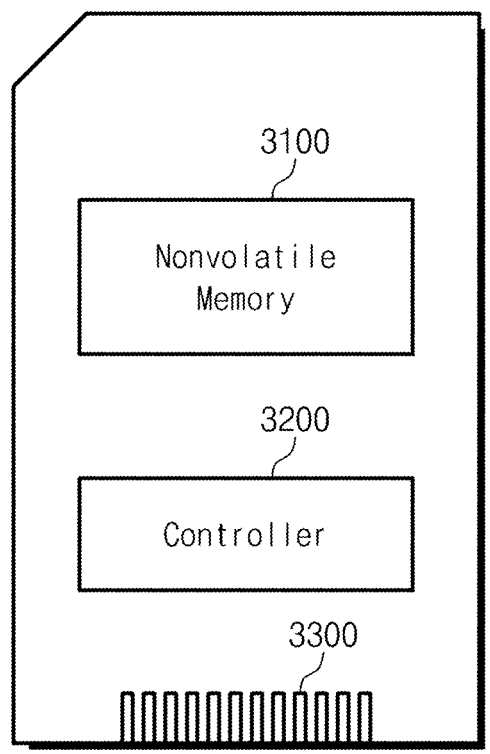
FIG. 22 is a block diagram schematically illustrating a memory card according to one exemplary embodiment.

FIG. 22 is a block diagram schematically illustrating a memory card 3000 according to one embodiment. Referring to FIG. 22, a memory card 3000 may include a nonvolatile memory 3100, a controller 3200, and a connector 3300.

In exemplary embodiments, the nonvolatile memory 3100 may be a nonvolatile memory 100 such as described with reference to FIGS. 1 to 19. The nonvolatile memory 3100 may include dummy memory cells or ground selection transistors having threshold voltages higher than a threshold voltage corresponding to an erase state as described with reference to FIGS. 1 to 19. The nonvolatile memory 3100 may first recover a voltage of a dummy word line or a ground selection line prior to voltages of other lines. The nonvolatile memory 3100 may apply a negative voltage to the dummy word line or the ground selection line. The connector 3300 may electrically connect the memory card 3000 and an external device (e.g., a host).

The memory card 3000 may be formed of memory cards such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and the like.

Figure 23:
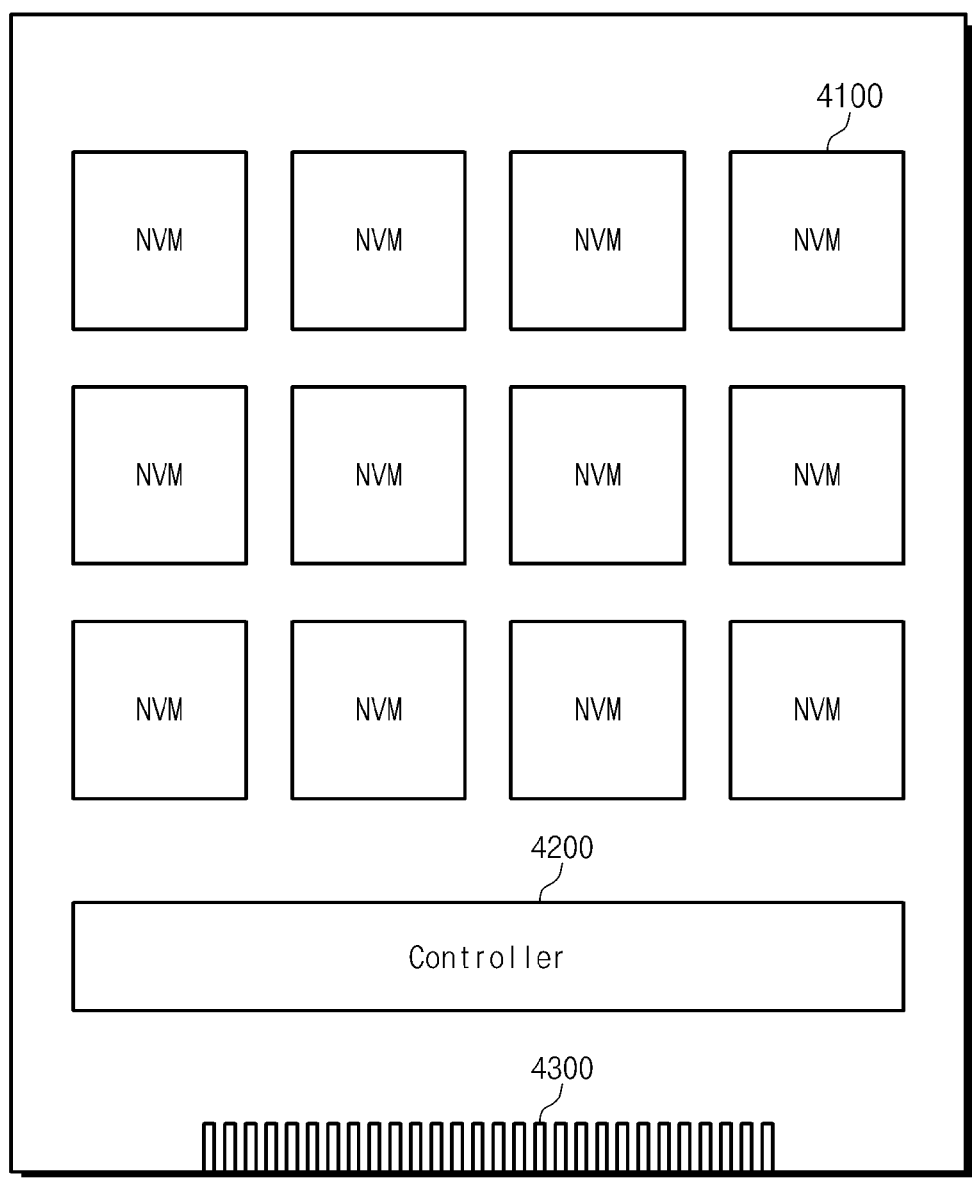
FIG. 23 is a block diagram schematically illustrating a solid state drive according to one exemplary embodiment.

FIG. 23 is a block diagram schematically illustrating a solid state drive 4000 according to one embodiment. Referring to FIG. 23, a solid state drive 4000 may include a plurality of nonvolatile memories 4100, a controller 4200, and a connector 4300.

In exemplary embodiments, each nonvolatile memory 4100 may include a nonvolatile memory 100 such as described with reference to FIGS. 1 to 19. The nonvolatile memory 4100 may include dummy memory cells or ground selection transistors having threshold voltages higher than a threshold voltage corresponding to an erase state as described with reference to FIGS. 1 to 19. The nonvolatile memory 4100 may first recover a voltage of a dummy word line or a ground selection line prior to voltages of other lines. The nonvolatile memory 4100 may apply a negative voltage to the dummy word line or the ground selection line. The connector 4300 may electrically connect the solid state drive 4000 and an external device (e.g., a host).

Figure 24:
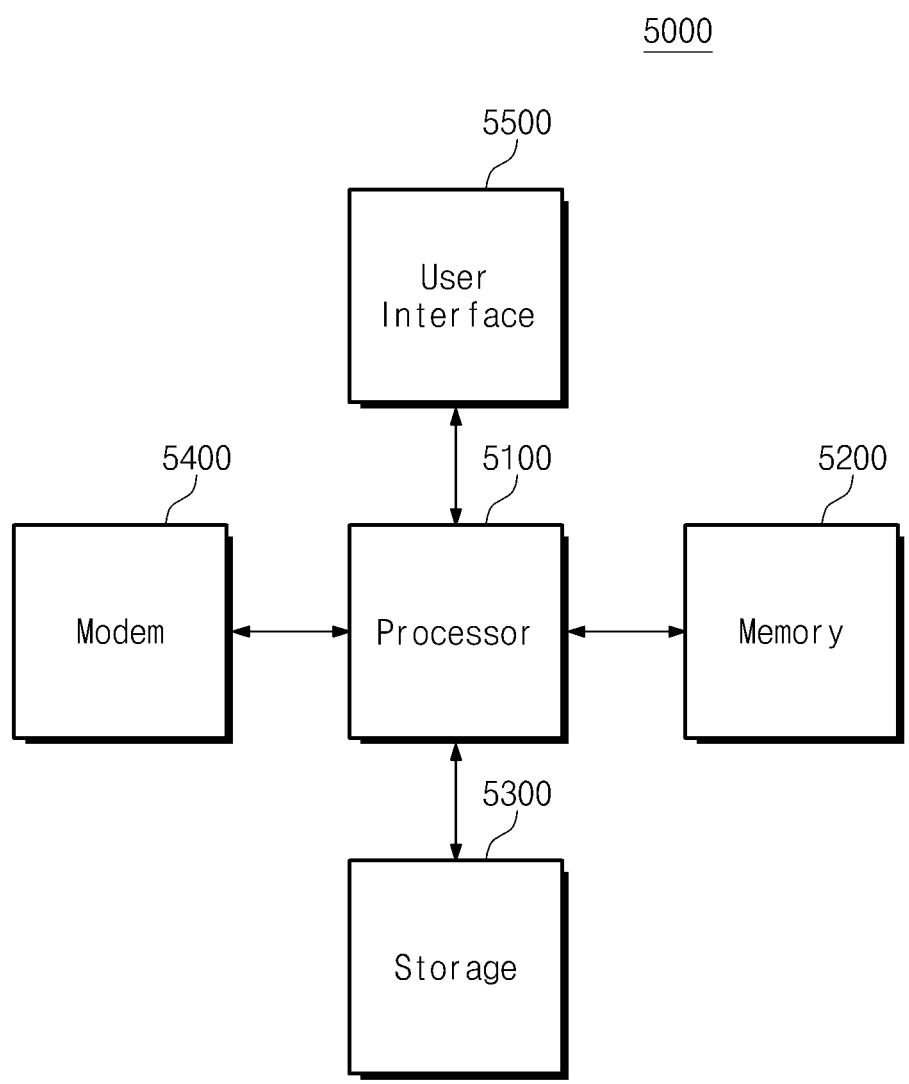
FIG. 24 is a block diagram schematically illustrating a computing device according to one exemplary embodiment.

FIG. 24 is a block diagram schematically illustrating a computing device 5000 according to one embodiment. Referring to FIG. 24, a computing device 5000 may include a processor 5100, a memory 5200, storage 5300, a modem 5400, and a user interface 5500.

The processor 5100 may control an overall operation of the computing device 5000, and may perform a logical operation. The processor 5100 may be formed, for example, of a system-on-chip (SoC). The processor 5100 may be a general purpose processor or an application processor.

The memory 5200 may communicate with the processor 5100. The memory 5200 may be a working memory (or, a main memory) of the processor 5100 or the computing device 5000. The memory 5200 may include a volatile memory such as a static RAM, a dynamic RAM, a synchronous DRAM, etc. or a nonvolatile memory such as a flash memory, a phase-change RAM (PRAM), a magnetic RAM (MRAM), a resistive RAM (RRAM), a ferroelectric RAM (FRAM), etc.

The storage 5300 may be used to store data for a long time in the computing device 5000. The storage 5300 may include a hard disk drive or a nonvolatile memory such as a flash memory, a PRAM (Phase-change RAM), an MRAM (Magnetic RAM), an RRAM (Resistive RAM), an FRAM (Ferroelectric RAM), etc.

In exemplary embodiments, the storage 5300 may be a nonvolatile memory 100 such as described with reference to FIGS. 1 to 19. The storage 5300 may include dummy memory cells or ground selection transistors having threshold voltages higher than a threshold voltage corresponding to an erase state as described with reference to FIGS. 1 to 19. The storage 5300 may first recover a voltage of a dummy word line or a ground selection line prior to voltages of other lines. The storage 5300 may apply a negative voltage to the dummy word line or the ground selection line.

In exemplary embodiments, the memory 5200 and the storage 5300 may be formed of the same type of nonvolatile memories. In this case, the memory 5200 and the storage 5300 may be integrated in a semiconductor integrated circuit.

The modem 5400 may communicate with an external device according to a control of the processor 5100. For example, the modem 5400 may communicate with the external device in a wire or wireless manner. The modem 5400 may communicate based on at least one of wireless communications manners such as LTE (Long Term Evolution), WiMax, GSM (Global System for Mobile communication), CDMA (Code Division Multiple Access), Bluetooth, NFC (Near Field Communication), WiFi, RFID (Radio Frequency Identification), and so on or wire communications manners such as USB (Universal Serial Bus), SATA (Serial AT Attachment), SCSI (Small Computer Small Interface), Firewire, PCI (Peripheral Component Interconnection), and so on.

The user interface 5500 may communicate with a user according to a control of the processor 5100. For example, the user interface 5500 may include user input interfaces such as a keyboard, a keypad, a button, a touch panel, a touch screen, a touch pad, a touch ball, a camera, a microphone, a gyroscope sensor, a vibration sensor, and so on. The user interface 5500 may further include user output interfaces such as an LCD, an OLED (Organic Light Emitting Diode) display device, an AMOLED (Active Matrix OLED) display device, an LED, a speaker, a motor, and so on.

While the present disclosure has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An operating method of a nonvolatile memory which includes a plurality of cell strings in a memory block, wherein the plurality of cell strings are arranged on a substrate in rows and columns and each of the cell strings includes a plurality of memory cells stacked in a direction perpendicular to the substrate, a ground selection transistor provided between the memory cells and the substrate, and a string selection transistor provided between the memory cells and a bit line, wherein two or more of the plurality of cells strings in the memory block are connected in common to the bit line, the operating method comprising:

adjusting a threshold voltage of at least one first memory cell adjacent to the substrate in each cell string to be higher than a threshold voltage distribution of an erase state;

reading a second memory cell located above the at least one first memory cell in each cell string;

checking threshold voltages of first memory cells in the plurality of cell strings; and if the threshold voltages of the first memory cells in the plurality of cell strings are determined to have decreased, re-adjusting the threshold voltages of the first memory cells in the plurality of cell strings to be higher than those in the threshold voltage distribution corresponding to the erase state, wherein the at least one first memory cell in each cell string is a dummy memory cell.

2. The operating method of claim 1, wherein the at least one first memory cell in each cell string is a memory cell closest among the stacked memory cells to the substrate.

3. The operating method of claim 1, wherein string selection transistors in a row of cell strings are connected in common to a string selection line of string selection lines, wherein ground selection transistors in two or more rows of cell strings are connected in common to a ground selection line, and wherein memory cells of the plurality of cell strings located at a same height from the substrate are connected in common to a word line of word lines.

4. The operating method of claim 3, wherein the reading a second memory cell located above the at least one first memory cell in each cell string comprises:

applying a turn-on voltage to a selected string selection line from among the string selection lines connected to the plurality of cell strings;

applying a turn-off voltage to an unselected string selection line of the string selection lines;

applying the turn-on voltage to the ground selection line connected to the plurality of cell strings;

applying the turn-on voltage to an unselected word line from the word lines connected to the plurality of cell strings;

applying a read voltage to a selected word line of the word lines; and applying a ground voltage to the selected string selection line, the word lines, and the ground selection line.

5. The operating method of claim 4, wherein when the ground voltage is applied to the word lines, first memory cells in the plurality of cell strings are turned off before a voltage of a first word line connected to the first memory cells in the plurality of cell strings reaches a level of the ground voltage.

6. The operating method of claim 4, wherein a first word line, connected to first memory cells in the plurality of cell strings, from among the word lines is supplied with the ground voltage before the ground voltage is applied to second word lines connected to second memory cells in the plurality of cell strings.

7. The operating method of claim 6, wherein the ground voltage is simultaneously supplied to the ground selection line and the first word line.

8. The operating method of claim 3, wherein the reading a second memory cell located above the at least one first memory cell in each cell string comprises:

applying a turn-on voltage to a selected string selection line from the string selection lines connected to the plurality of cell strings;

applying a turn-off voltage to an unselected string selection line of the string selection lines;

applying the turn-on voltage to the ground selection line connected to the plurality of cell strings;

applying the turn-on voltage to an unselected word line from the word lines connected to the plurality of cell strings;

applying a read voltage to a selected word line of the word lines; and applying a ground voltage to the selected string selection line and the ground selection line, a negative voltage to a first word line, connected to first memory cells of the plurality of cell strings, from among the word lines, and the ground voltage to second word lines connected to second memory cells of the plurality of cell strings.

9. The operating method of claim 8, wherein the negative voltage is applied to the first word line before the ground voltage is applied to the second word lines.

10. The operating method of claim 3, wherein the reading a second memory cell located above the at least one first memory cell in each cell string comprises:
applying a turn-on voltage to a selected string selection line from the string selection lines connected to the plurality of cell strings;
applying a turn-off voltage to an unselected string selection line of the string selection lines;
applying the turn-on voltage to the ground selection line connected to the plurality of cell strings;
applying the turn-on voltage to an unselected word line from the word lines connected to the plurality of cell strings;
applying a read voltage to a selected word line of the word lines, the selected word line connected to the second memory cell; and
applying a ground voltage to the selected string selection line, a negative voltage to the ground selection line and a first word line, connected to first memory cells of the plurality of cell strings, from among the word lines, and the ground voltage to second word lines connected to second memory cells of the plurality of cell strings.

11. The operating method of claim 1, wherein the reading a second memory cell located above the at least one first memory cell in each cell string comprises:
applying a turn-on voltage to a selected string selection line from the string selection lines connected to the plurality of cell strings;
applying a turn-off voltage to an unselected string selection line of the string selection lines;
applying the turn-on voltage to the ground selection line connected to the plurality of cell strings;
applying the turn-on voltage to an unselected word line from the word lines connected to the plurality of cell strings;
applying a read voltage to a selected word line of the word lines; and
applying a ground voltage to the selected string selection line and the word lines and a negative voltage to the ground selection line.

12. The operating method of claim 1, wherein the checking and the re-adjusting are performed periodically according to numbers of read, write or erase operations performed.

13. A nonvolatile memory comprising:
a memory cell array including a plurality of cell strings in a memory block, wherein the plurality of cell strings are arranged on a substrate in rows and columns and each of the cell strings includes a plurality of memory cells stacked in a direction perpendicular to the substrate, a ground selection transistor provided between the memory cells and the substrate, and a string selection transistor provided between the memory cells and a bit line, wherein two or more of the plurality of cells strings in the memory block are connected in common to the bit line;
an address decoder connected to the memory cells in the plurality of cell strings through word lines, to string selection transistors of the plurality of cell strings through string selection lines, and to ground selection transistors of the plurality of cell strings through a ground selection line; and
a read/write circuit connected to the string selection transistors of the plurality of cell strings through bit lines,
wherein when a read operation ends, the address decoder is configured to apply a ground voltage to the string selection lines, the word lines, and the ground selection line, and
wherein at least one first memory cell, including a dummy memory cell closest to the substrate, from among the memory cells in each cell string maintains a threshold voltage higher than a threshold voltage distribution corresponding to an erase state.

14. The nonvolatile memory of claim 13, wherein
the at least one first memory cell maintains the threshold voltage in spite of execution of erase operations.

15. An operating method of a nonvolatile memory which includes a plurality of cell strings in a memory block, wherein the plurality of cell strings are arranged on a substrate in rows and columns and each of the cell strings includes a plurality of memory cells stacked in a direction perpendicular to the substrate and including a closest memory cell to the substrate and a furthest memory cell from the substrate, a ground selection transistor provided between the memory cells and the substrate, and a string selection transistor provided between the memory cells and a bit line, wherein two or more of the plurality of cells strings in the memory block are connected in common to the bit line, the operating method comprising:
at a first time, applying a first turn-on voltage to a selected string select line connected to a first cell string of the plurality of cell strings;
at the first time, applying a second turn-on voltage to a ground select line connected to the ground selection transistor of the first cell string;
at the first time, applying a third turn-on voltage to a first word line connected to the closest memory cell to the substrate for the first cell string;
at a second time, applying a fourth voltage to a selected word line, the fourth voltage having a value among threshold distribution ranges of the plurality of memory cells, and the word line connected to a row of cell strings;
at a third time subsequent to the first and second time, discharging or applying a negative voltage to at least one of the first word line and the ground select line; and
during a recovery period interval between the third time and a fourth time that is subsequent to the third time, discharging the selected word line.

16. The operating method of claim 15, further comprising:
at the third time, discharging or applying the negative voltage to the first word line; and
at the fourth time, discharging the ground select line.

17. The operating method of claim 15, further comprising:
at the third time, discharging both the first word line and the ground select line.

18. The operating method of claim 15, further comprising:
applying a pre-pulse to the selected word line prior to applying the fourth voltage to the selected word line.

19. The operating method of claim 15, wherein:
the first word line is a dummy word line.

* * * * *